US009031822B2

(12) United States Patent
Sarma et al.

(10) Patent No.: US 9,031,822 B2
(45) Date of Patent: May 12, 2015

(54) SYSTEM AND METHOD FOR USE IN SIMULATING A SUBTERRANEAN RESERVOIR

(71) Applicants: Pallav Sarma, San Ramon, CA (US); Wen Hsiung Chen, Danville, CA (US)

(72) Inventors: Pallav Sarma, San Ramon, CA (US); Wen Hsiung Chen, Danville, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 0 days.

(21) Appl. No.: 13/843,096

(22) Filed: Mar. 15, 2013

(65) Prior Publication Data
US 2013/0338983 A1 Dec. 19, 2013

Related U.S. Application Data

(60) Provisional application No. 61/660,012, filed on Jun. 15, 2012.

(51) Int. Cl.
G06G 7/48 (2006.01)
G06G 7/50 (2006.01)
G06F 17/50 (2006.01)
G01V 99/00 (2009.01)

(52) U.S. Cl.
CPC .......... *G06F 17/5009* (2013.01); *G01V 99/005* (2013.01); *G01V 2210/665* (2013.01)

(58) Field of Classification Search
CPC ............ G06F 17/5009; G06F 17/5018; G06F 17/5022; G06F 2217/16; G01V 11/00; G01V 99/00; G01V 99/005
USPC ....................................................... 703/9, 10
See application file for complete search history.

(56) References Cited

U.S. PATENT DOCUMENTS

| 4,969,130 | A | 11/1990 | Wason et al. |
| 5,992,519 | A | 11/1999 | Ramakrishnan et al. |
| 7,584,081 | B2 | 9/2009 | Wen et al. |
| 8,032,345 | B2 | 10/2011 | Le Ravalec et al. |
| 2002/0016703 | A1 | 2/2002 | Barroux |
| 2007/0118346 | A1 | 5/2007 | Wen et al. |
| 2007/0255500 | A1 | 11/2007 | Pita et al. |
| 2007/0271077 | A1 | 11/2007 | Kosmala |
| 2008/0065363 | A1 | 3/2008 | Middya |
| 2009/0070086 | A1 | 3/2009 | Le Ravalec et al. |

(Continued)

FOREIGN PATENT DOCUMENTS

| EP | 1 975 879 A2 | 10/2008 |
| JP | H02-286899 | 11/1990 |
| KR | 10-20050037342 A | 4/2005 |

OTHER PUBLICATIONS

Sarma (Efficient Closed-Loop optimal control of petroleum reservoir under uncertainty, 2006 (221 pages).*

(Continued)

*Primary Examiner* — Kamini S Shah
*Assistant Examiner* — Andre Pierre Louis

(57) ABSTRACT

A computer-implemented method, system, and computer program product are disclosed for updating simulation models of a subterranean reservoir. An ensemble of reservoir models representing a subterranean reservoir having non-Gaussian characteristics is provided and the ensemble of reservoir models is updated using a subspace ensemble Kalman filter. Kemal principle component analysis parameterization or K-L expansion parameterization can be used to update the ensemble of reservoir models.

20 Claims, 39 Drawing Sheets

(56) References Cited

U.S. PATENT DOCUMENTS

| | | | |
|---|---|---|---|
| 2009/0157590 A1 | 6/2009 | Mijares et al. | |
| 2010/0198570 A1 | 8/2010 | Sarma et al. | |
| 2011/0218737 A1* | 9/2011 | Gulati | 702/16 |
| 2012/0215511 A1 | 8/2012 | Sarma et al. | |
| 2013/0338983 A1 | 12/2013 | Sarma et al. | |
| 2014/0136165 A1 | 5/2014 | Sarma et al. | |

OTHER PUBLICATIONS

Abul Fahimuddin (4D Seismic history matching using ensemble Kalman filter (EnKF), 2010 (116 pages).*
Zupanski (Ensemble Kalman Filter, 2006 (37 pages)).*
Gu, Yaqing, et al.; "History Matching of the PUNQ-S3 Reservoir Model Using the Ensemble Kalman Filter"; SPE Journal, Jun. 2005, pp. 217-224.
Li, Gaoming, et al.; "An Iterative Ensemble Kalman Filter for Data Assimilation"; 2007, SPE 109808, pp. 1-18.
Li, Xin; "Continuous Reservoir Model Updating by Ensemble Kalman Filter on Grid Computing Architectures"; a Dissertation, Dec. 2008, Title Page, Acknowledgments, Table of Contents, List of Tables, List of Figures, Abstract, and Chapter 1, Part 1.
Li, Xin; "Continuous Reservoir Model Updating by Ensemble Kalman Filter on Grid Computing Architectures"; a Dissertation, Dec. 2008, Chapters 2-3, Part 2.
Li, Xin; "Continuous Reservoir Model Updating by Ensemble Kalman Filter on Grid Computing Architectures"; a Dissertation, Dec. 2008, Chapters 4-5, Part 3.
Li, Xin; "Continuous Reservoir Model Updating by Ensemble Kalman Filter on Grid Computing Architectures"; a Dissertation, Dec. 2008, Chapters 6-8 (Sections 8.1 through 8.3 p. 130)), Part 4.
Li, Xin; "Continuous Reservoir Model Updating by Ensemble Kalman Filter on Grid Computing Architectures"; a Dissertation, Dec. 2008, continuation of Chapter 8 (Section 8.3 through Section 8.5), Chapter 9, Bibliography, Appendices A-D, Part 5.
Kiczko, Adam; "Multi-Criteria Decision Support System for Siemianowka Reservoir Under Uncertainties"; XP055115037, International Institute for Applied Systems (IIASA) Interim Report, No. IR-08-026, Sep. 2008, pp. i-viii and pp. 1-18.
Kwok, James Tin-Yau, et al.; "The Pre-Image Problem in Kernel Methods"; IEEE Transactions of Neural Networks, Nov. 2004, vol. 15, No. 6, pp. 1517-1525.
Naevdal, Gier, et al.; "Near-Well Reservoir Monitoring Through Ensemble Kalman Filter"; SPE 75235, 2002, pp. 1-9.
Naevdal, Gier, et al.; "Reservoir Monitoring and Continuous Model Updating Using Ensemble Kalman Filter"; 2003, SPE 84372, pp. 1-12.
Ott, Edward, et al.; "A Local Ensemble Kalman Filter for Atmospheric Data Assimilation"; Tellus, 2004, vol. 56A, pp. 415-428.
Ralaivola, Liva, et al.; "Time Series Filtering, Smoothing and Learning using the Kernel Kalman Filter"; Proceedings of International Joint Conference on Neural Networks, Montreal, Canada, Jul. 31 through Aug. 4, 2005, pp. 1449-1454.
Sarma, Pallav, et al.; "A New Approach to Automatic History Matching Using Kernel PCA"; 2007, SPE 106176, pp. 1-19.
Sarma, Pallav, et al.; "Kernel Principal Component Analysis for Efficient, Differentiable Parameterization of Multipoint Geostatistics"; Math Geosci., 2008, vol. 40, pp. 3-32.
Sarma, Pallav, et al.; "Selecting Representative Models from a Large Set of Models"; 2013, SPE 163671, XP008167129, pp. 1-12 with attached Figure 15.
Scheidt, Celine, et al.; "Bootstrap Confidence Intervals for Reservoir Model Selection Techniques"; 2010, XP019767904, Comput. Geosci., vol. 14, pp. 369-382.
Scholkopf, Bernhard, et al.; "Nonlinear Component Analysis as a Kernel Eigenvalue Problem"; 1998 Massachusetts Institute of Technology, Neural Computation, vol. 10, pp. 1299-1319.
Scholkopf, Bernhard, et al.; "Learning with Kernels"; 2002 Massachusetts Institute of Technology, Title pages (2), A Tutorial Introduction, Chapters 1 and 2 (Part 1).
Scholkopf, Bernhard, et al.; "Learning with Kernels"; 2002 Massachusetts Institute of Technology, pp. 58-60, Chapter 14, pp. 427-456, Chapter 18, pp. 544-568 (Part 2).
Skjervheim, J.A., et al.; "Incorporating 4D Seismic Data in Reservoir Simulation Models Using Ensemble Kalman Filter"; Sep. 2007, SPE Journal, pp. 282-292.
Srinivasan, Balaji Vasan; "Gaussian Process Regression for Model Estimation"; Thesis, 2008, University of Maryland.
Strebelle, Sebastien; "Conditional Simulation of Complex Geological Structures Using Multiple-Point Statistics"; Jan. 2002, Mathematical Geology, vol. 34, No. 1, pp. 1-21.
Vabo, J.G., et al; "Using the EnKF with Kernel Methods for Estimation of Non-Gaussian Variables"; 11$^{th}$ European Conference on the Mathematics of Oil Recovery, Bergen, Norway, Sep. 8-11, 2008, pp.
Wen, X.H., et al.; "Real-Time Reservoir Model Updating Using Ensemble Kalman Filter"; 2005, SPE 92991, pp. 1-14.
Zhang, Tuanfeng; "Filter-Based Training Pattern Classification for Spatial Pattern Simulation"; Dissertation, Mar. 2006, submitted to The Department of Geological and Environmental Sciences and to Stanford University, Chapters 1-4 (Part 1).
Zhang, Tuanfeng; "Filter-Based Training Pattern Classification for Spatial Pattern Simulation"; Dissertation, Mar. 2006, submitted to The Department of Geological and Environmental Sciences and to Stanford University, continuation of Chapter 4 through Chapter 8 (Part 2).
Non-Final Office Action mailed Aug. 1, 2012, during the prosecution of Co-Pending U.S. Appl. No. 12/657,929, filed Jan. 29, 2010.
Non-Final Office Action mailed Jun. 7, 2013, during the prosecution of Co-Pending U.S. Appl. No. 12/657,929, filed Jan. 29, 2010.
Non-Final Office Action mailed May 9, 2014, during the prosecution of Co-Pending U.S. Appl. No. 12/657,929, filed Jan. 29, 2010.
Non-Final Office Action mailed Dec. 28, 2012, during the prosecution of Co-Pending U.S. Appl. No. 13/029,534, filed Feb. 17, 2011.
Final Office Action mailed Sep. 6, 2013, during the prosecution of Co-Pending U.S. Appl. No. 13/029,534, filed Feb. 17, 2011.
Non-Final Office Action mailed Jun. 4, 2014, during the prosecution of Co-Pending U.S. Appl. No. 13/029,534, filed Feb. 17, 2011.
Aanonsen, Sigurd I., et al; "The Ensemble Kalman Filter in Reservoir Engineering—a Review"; SPE Journal, Sep. 2009, pp. 393-412.
Aziz, A., et al.; "Petroleum Reservoir Simulation"; Applied Science Publishers Ltd., London and New York, 1979, Title pages, and pp. 260-297.
Bickel, J. Eric, et al.; "Discretion, Simulation, and Swanson's (Inaccurate) Mean"; SPE Economics & Management, XP055115036A, Jul. 2011, pp. 128-140.
Biedermann, Stefanie, et al.; "Some Robust Design Strategies for Percentile Estimation in Binary Response Models"; The Canadian Journal of Statistics, vol. 34, No. 4, Dec. 2006, pp. 603-622.
Evensen, Gier; "Sequential Data Assimilation with a Nonlinear Quasi-Geostrophic Model Using Monte Carlo Methods to Forecast Error Statistics"; Journal of Geophysical Research, May 15, 1994, vol. 99, No. C5, pp. 10,143-10,162.
Evensen, Gier; "The Ensemble Kalman Filter: Theoretical Formulation and Practical Implementation"; 2003, Ocean Dynamics, vol. 53, pp. 343-367.
Fahimuddin, Abul, et al.; "4D Seismic History Matching of a Real Field Case with EnKF: Use of Local Analysis for Modeling Updating"; SPE 134894, 2010 SPE Annual Technical Conference and Exhibition in Florence, Tuscany, Italy, Sep. 20-22, 2010, SPE 134894, pp. 1-16.
Fahimuddin, Abul; "4D Seismic History Matching Using the Ensemble Kalman Filter (EnKF): Possibilities and Challenges"; Thesis, Mar. 2010, Title Page, Summary, Preface, Acknowledgements, and Table of Contents, Part 1.
Fahimuddin, Abul; "4D Seismic History Matching Using the Ensemble Kalman Filter (EnKF): Possibilities and Challenges"; Thesis, Mar. 2010, Chapters 1 and 2, Part 2.
Fahimuddin, Abul; "4D Seismic History Matching Using the Ensemble Kalman Filter (EnKF): Possibilities and Challenges"; Thesis, Mar. 2010, Chapters 3-4, Part 3.
Fahimuddin, Abul; "4D Seismic History Matching Using the Ensemble Kalman Filter (EnKF): Possibilities and Challenges"; Thesis, Mar. 2010, Chapters 5-6, Part 4.

(56) References Cited

OTHER PUBLICATIONS

Fahimuddin, Abul; "4D Seismic History Matching Using the Ensemble Kalman Filter (EnKF): Possibilities and Challenges"; Thesis, Mar. 2010, Chapters 7-8, and Bibliography, Part 5.

International Search Report, issued on Aug. 25, 2010, during the prosecution of International Application No. PCT/US2010/022584.

Written Opinion of the International Searching Authority, issued on Aug. 25, 2010, during the prosecution of International Application No. PCT/US2010/022584.

International Search Report, issued on Sep. 19, 2012 during the prosecution of International Application No. PCT/US2012/025357.

Written Opinion of the International Searching Authority, issued on Sep. 19, 2012 during the prosecution of International Application No. PCT/US2012/025357.

International Search Report, issued on Jun. 25, 2014 during the prosecution of International Application No. PCT/US2013/045386.

Written Opinion of the International Searching Authority, issued on Jun. 25, 2014 during the prosecution of International Application No. PCT/US2013/045386.

International Search Report, issued on May 20, 2014, during the prosecution of International Application No. PCT/US2013/069808.

Written Opinion of the International Searching Authority, issued on May 20, 2014, during the prosecution of International Application No. PCT/US2013/069808.

* cited by examiner

Linear PCA

Kernel PCA

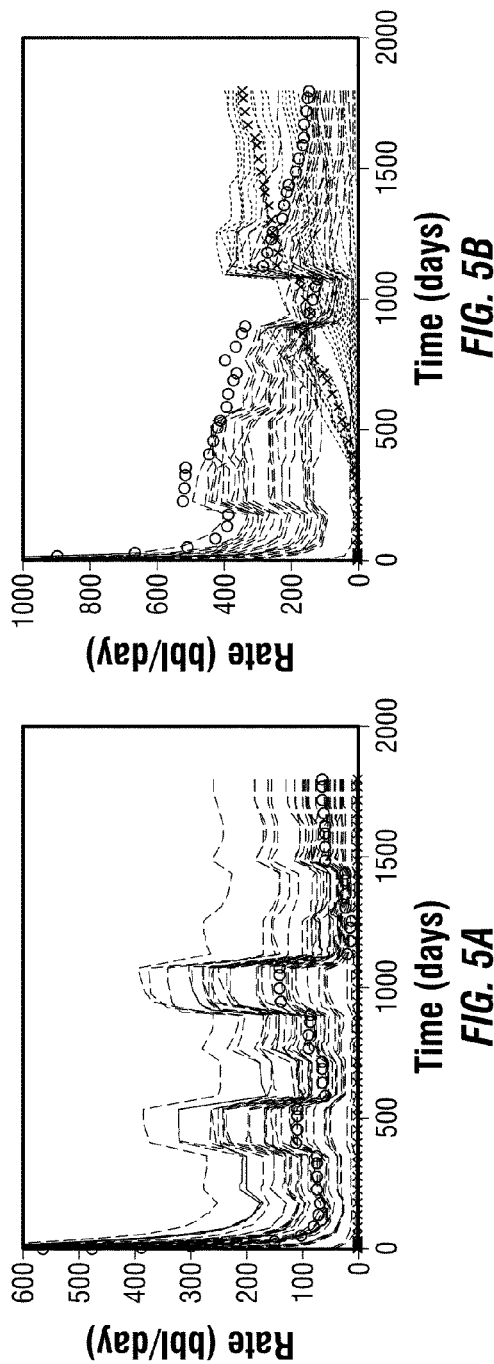
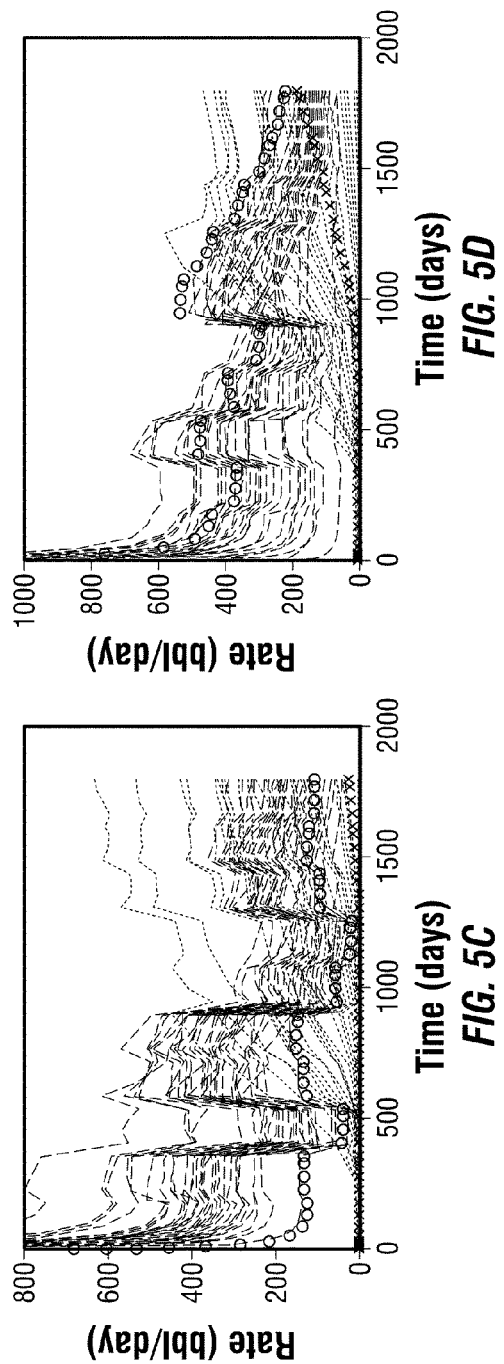
FIG. 5A
FIG. 5B
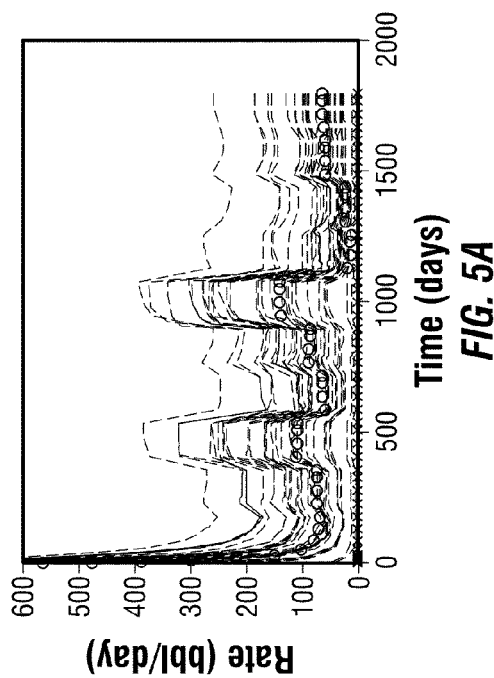
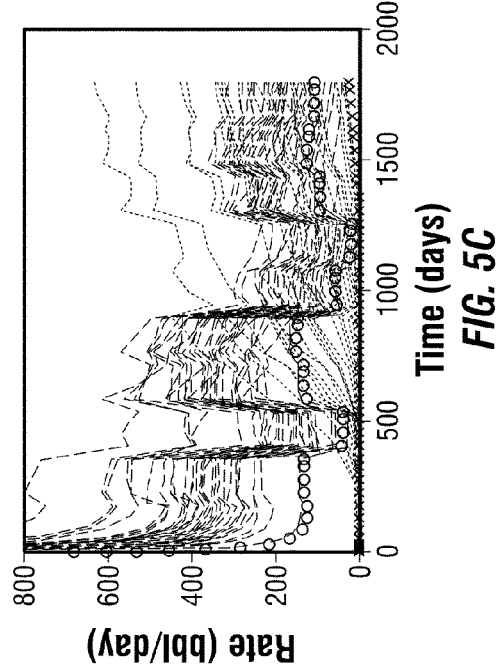
FIG. 5C
FIG. 5D

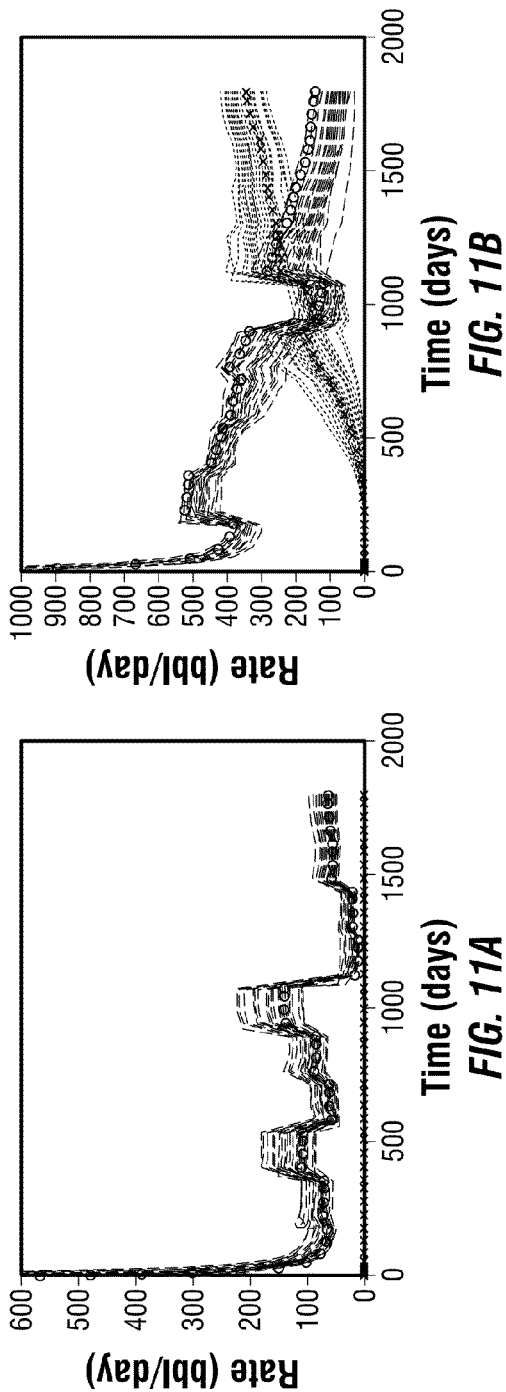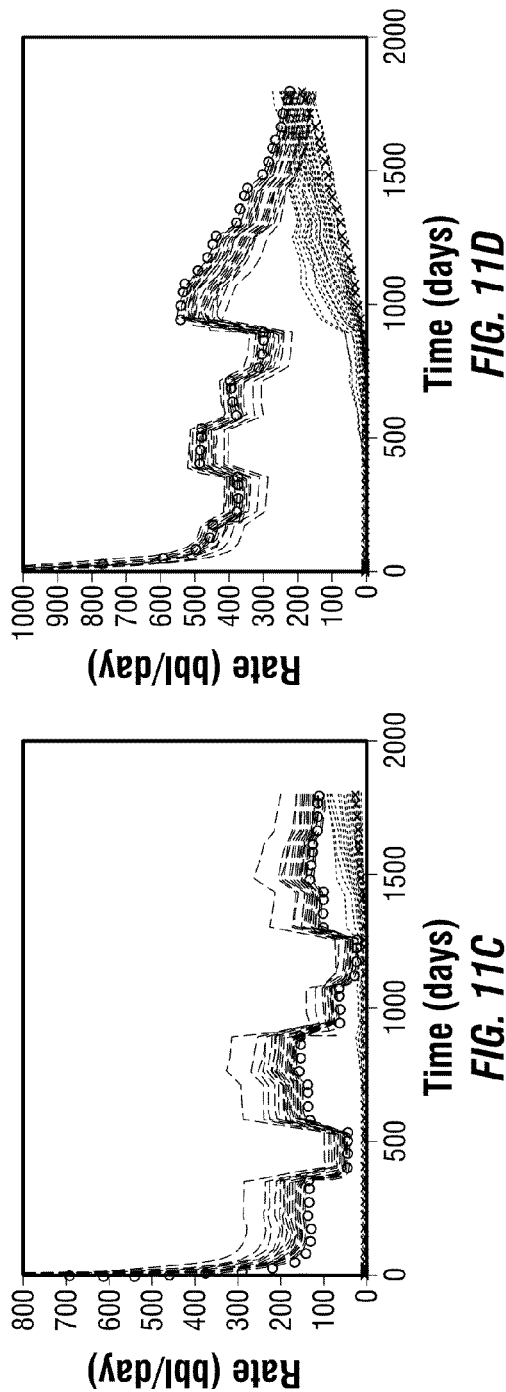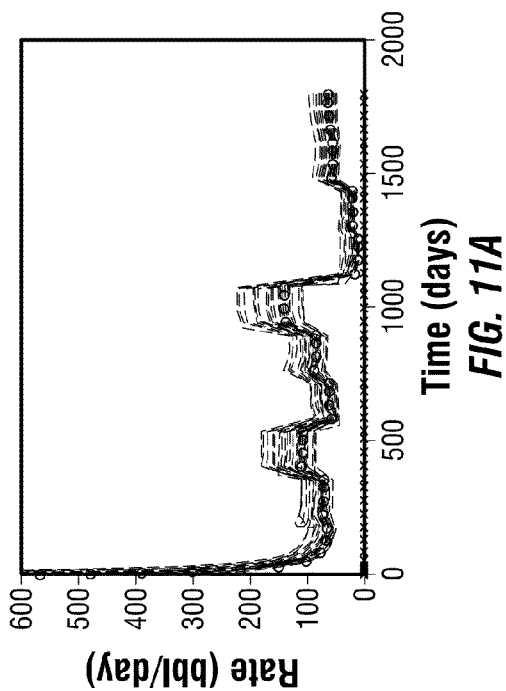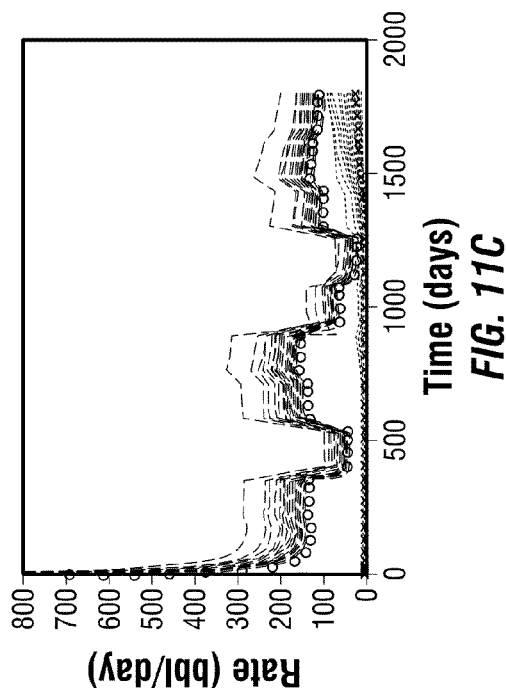
FIG. 11A
FIG. 11B
FIG. 11C
FIG. 11D

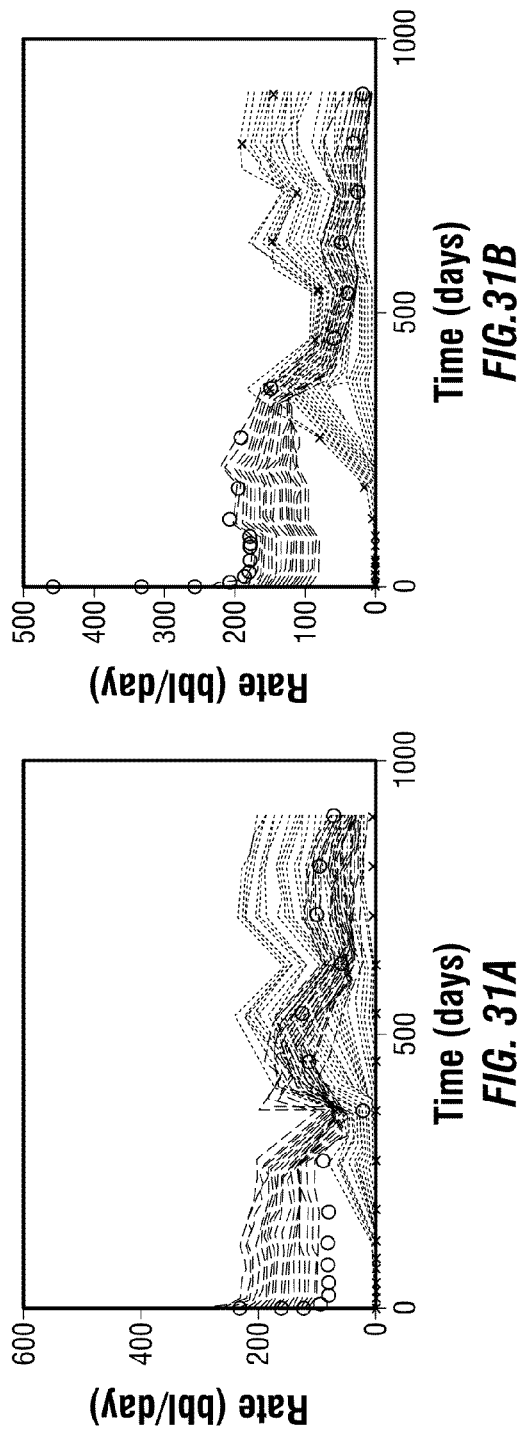
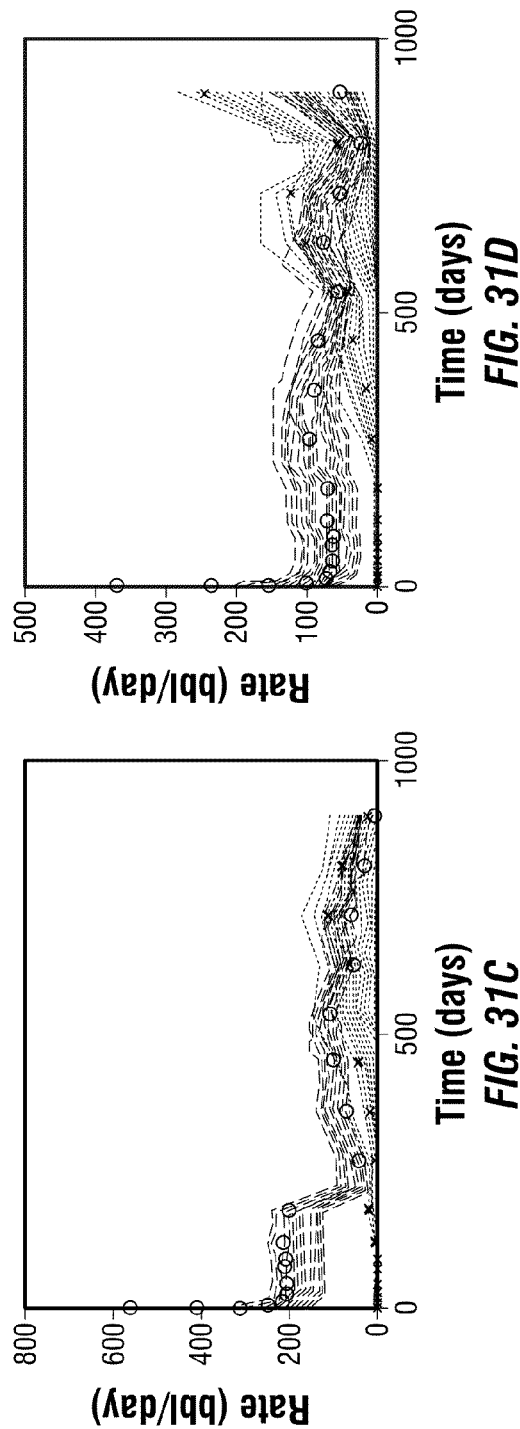
FIG. 31A
FIG. 31B
FIG. 31C
FIG. 31D

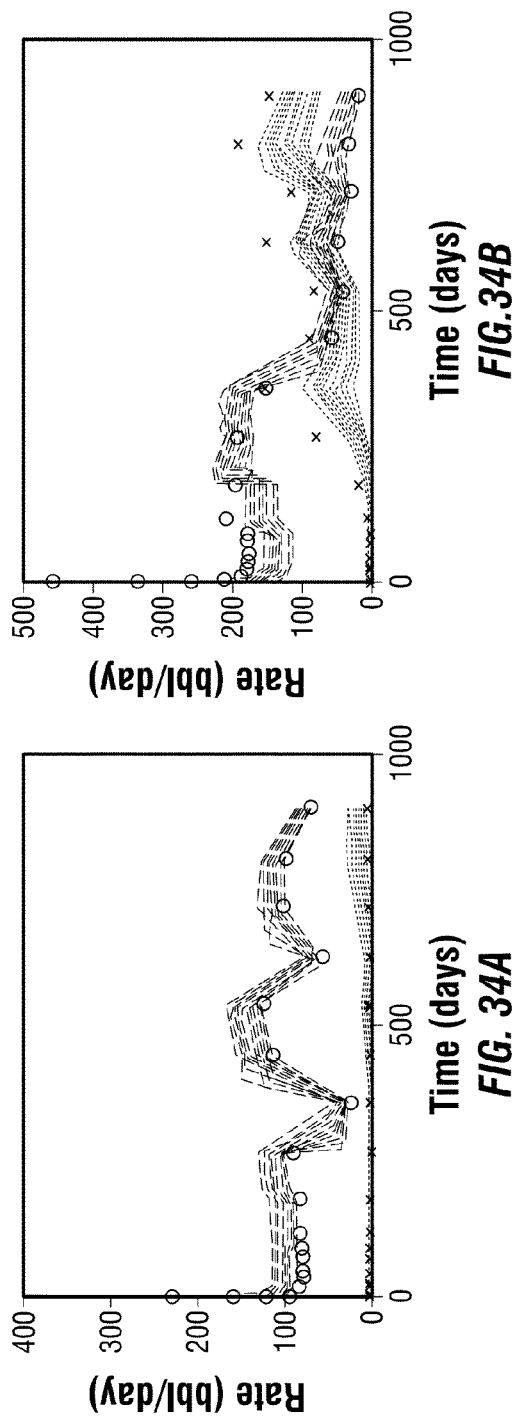
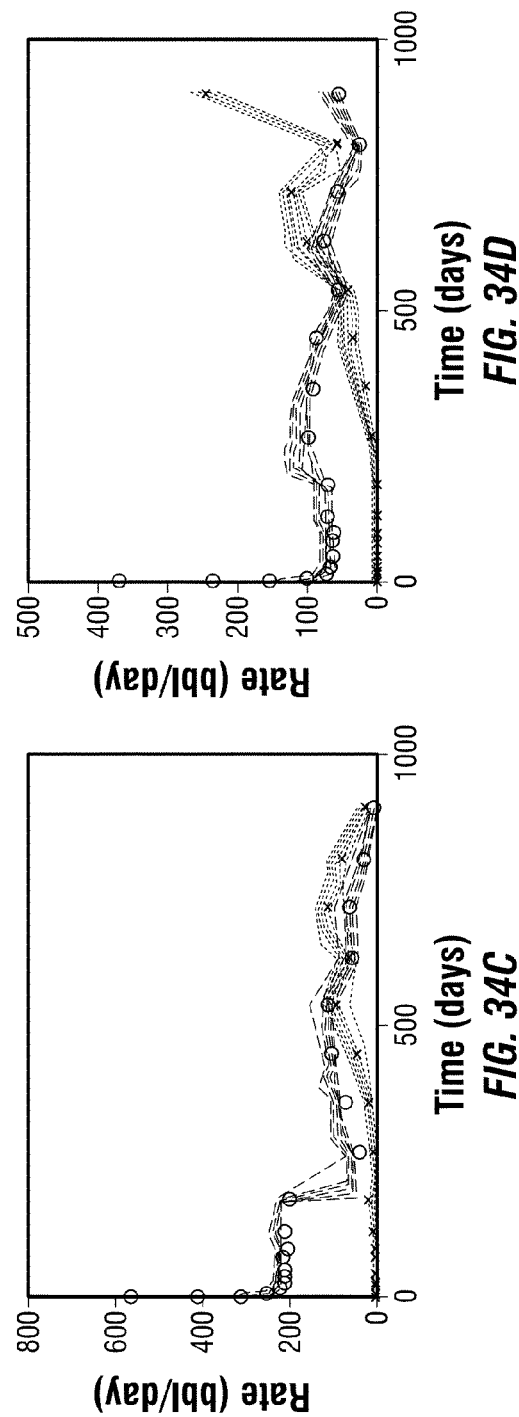
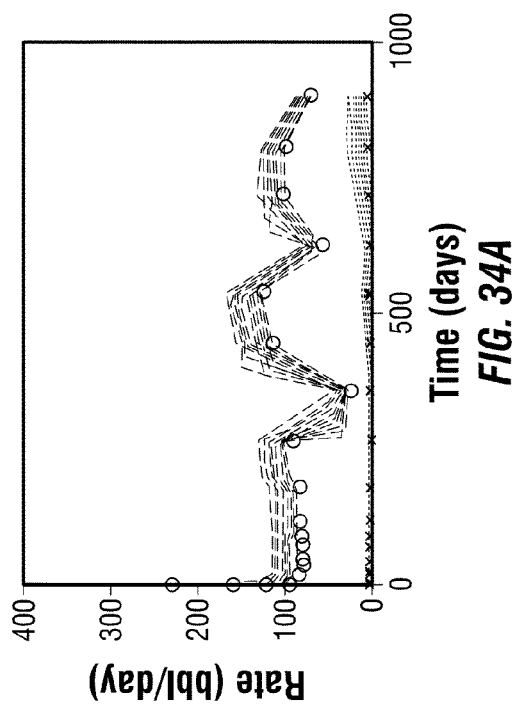
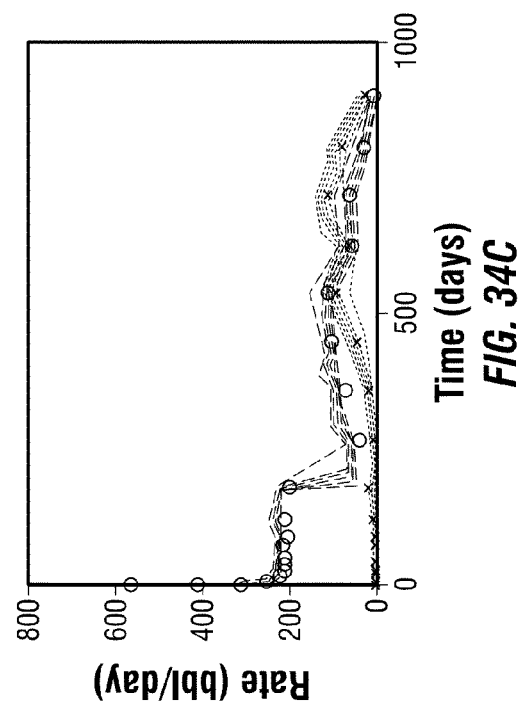
FIG. 34A
FIG. 34B
FIG. 34C
FIG. 34D

SYSTEM AND METHOD FOR USE IN SIMULATING A SUBTERRANEAN RESERVOIR

CROSS-REFERENCE TO A RELATED APPLICATION

The present application for patent claims the benefit of U.S. provisional patent application bearing Ser. No. 61/660,012 filed on Jun. 15, 2012, which is incorporated by reference in its entirety.

TECHNICAL FIELD

This invention relates to simulation of a subterranean reservoir, and more particularly, to a system, method, and computer program product for updating simulation models of a subterranean reservoir such as by utilizing subspace ensemble Kalman filters.

BACKGROUND

The ensemble Kalman filter (EnKF) has recently received significant attention as a robust and efficient tool for data assimilation. Although the EnKF has many advantages such as ease of implementation and efficient uncertainty quantification, it suffers from a few key issues that limit the application of the EnKF to large-scale simulation models of real fields. Among these various issues, one of the important ones is the well known problem of ensemble collapse, which is particularly evident for small ensembles. The problem arises because all the ensemble members are driven in more or less the same direction through each ensemble update. This implies that as the members are updated again and again, they will ultimately converge towards the same ensemble member. This results in an artificial reduction of variability across the ensemble, resulting in a poor quantification of uncertainty. The second, more important problem is that the EnKF is theoretically appropriate only if all ensemble members belong to the same multi-Gaussian random field (geological/geostatistical model). This is because the updated ensemble members are a linear combination of the forecasted ensemble members. If each ensemble member has different geostatistical properties, the updated ensemble members will not be able to honor these geostatistical properties. Ultimately, all the updated ensemble members will have similar geostatistical properties. This is an important problem because there is more than one geological scenario for most real fields, and it is desired to obtain one or more history-matched models for each geological scenario. One way to resolve this problem is to apply a different EnKF for each geological scenario. This however, is not very efficient as this increases the computational burden N times over the standard EnKF for N geological scenarios. For example, if each EnKF has 100 ensemble members (a typical number), and there are 10 geological scenarios, this approach would require 1000 simulations, which may not be practical for large-scale models.

SUMMARY

In embodiments, a computer-implemented method, system, and computer program product are disclosed for updating simulation models of a subterranean reservoir. An ensemble of reservoir models representing a subterranean reservoir having non-Gaussian characteristics is provided and the ensemble of reservoir models is updated using a subspace ensemble Kalman filter.

In embodiments, kernel principle component analysis parameterization or K-L expansion parameterization can be used to update the ensemble of reservoir models.

BRIEF DESCRIPTION OF THE DRAWINGS

FIGS. 5A-5D show oil and water production rates of an initial ensemble for 4 producers, and the observed rates (circles for oil and X's for water).

FIGS. 11A-11D show oil and water production rates of the final ensemble for the 4 producers, and the observed rates (circles for oil and X's for water) for the subspace EnKF.

FIG. 31A-31D show oil and water production rates of the initial ensemble for the 4 producers, and the observed rates (circles for oil and X's for water) for the subspace iterative EnS with KPCA (order 5) parameterization.

FIG. 34 shows oil and water production rates of the final ensemble for the 4 producers, and the observed rates (circles for oil and X's for water) for the subspace iterative EnS with KPCA (order 5) parameterization.

DETAILED DESCRIPTION

Figure 1A:
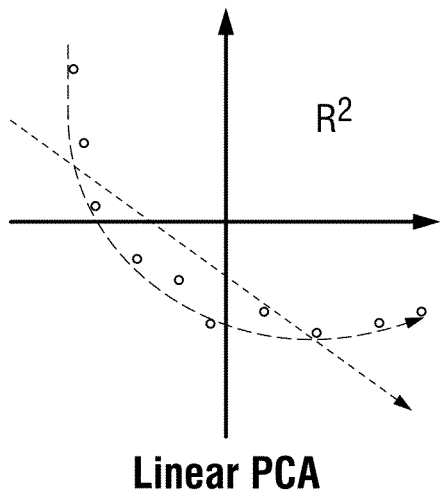
FIGS. 1A and 1B are schematics comparing linear PCA with kernel PCA.

Embodiments of the present invention relate to a variant of the Ensemble Kalman Filter (EnKF) method, which is referred to herein as the subspace EnKF. The subspace EnKF constrains each ensemble member to a small subspace of the full space to which the ensemble members belong. This is done by applying a different parameterization for each ensemble member, such that the parameterization ensures that each ensemble member remains in the subspace to which it is constrained through any number of updates. If the subspaces are disjoint, this ensures that the ensemble does not collapse. Further, if each parameterization is chosen to honor different geostatistical properties, then these statistics will also be honored throughout the updates. Accordingly, the geostatistical properties of each ensemble member are retained though each update. However, this approach implies that each ensemble member has a different forward model, which violates an important assumption of the EnKF, whereby each ensemble member should have the same forward model. Through proper modification of the EnKF equations using the gradients of the different parameterizations, this inconsistency can be mitigated. As will be described, the subspace EnKF prevents ensemble collapse and honors geological constraints much better compared to the standard EnKF.

The Ensemble Kalman Filter

The EnKF is a temporally sequential data assimilation method. At each assimilation time, the following steps are performed: a forecast step (evaluation of the dynamic system), followed by a data assimilation step (calculation of Kalman gain), and then by an update of the state variables of the EnKF (Kalman update).

The state variables of the EnKF typically consist of the following types of variables: static variables (such as permeability, porosity), dynamic variables (such as pressure, saturation), and production data (such as bottom hole pressures, production and injection rates). Thus, the state vector of the EnKF at a given assimilation time can be written as:

$$y_j = \begin{bmatrix} m \\ x \\ d \end{bmatrix}_j \forall j = 1, \ldots, M \tag{1}$$

Here, $y_j \in R^{N_s}$ is the jth ensemble member, m are the static variables, x are the dynamic variables, and $d \in R^{N_d}$ are the production data to be assimilated. The number of ensemble members is M. Before the EnKF can be applied, an initial ensemble of the static and dynamic variables is created. Usually, geostatistical techniques are used to create the ensemble of static variables (e.g., permeability field) corresponding to prior knowledge of the geology and hard data. However, the dynamic variables are usually considered known without uncertainty, primarily because the uncertainty of the dynamic variables such as pressure and saturation at the initial time is smaller compared to that of the static variables, as the reservoir is generally in dynamic equilibrium before start of production. In any case, if the initial dynamic variables are considered uncertain, it can be easily reflected through the initial ensemble. There is usually no production data available initially.

Once the initial ensemble is created, the forecast step can be performed, wherein the dynamic system (i.e., the reservoir simulation model) is evaluated to the next assimilation time using the current estimates of the static and dynamic variables. The simulator has to be run once for each ensemble member (M times). This provides the forecasted dynamic variables and production data at the next assimilation step, and the step can be written compactly as:

$$y_{j,k}^f = f(y_{j,k-1}^u) \forall j=1,\ldots,M \tag{2}$$

Here $y^f$ is the forecasted state vector obtained after the forecast step, $y^u$ is the updated state vector obtained after the Kalman update, and subscript k stands for the assimilation time. f depicts the reservoir simulation equations. In most cases, the assimilation time subscript k is removed from discussions below for brevity.

After the forecasted state vector is obtained, the data assimilation step is performed, wherein, the Kalman gain is calculated using the static and dynamic variables and production data obtained from the forecast step, and is given as:

$$K_g = C_y^f H^T (H C_y^f H^T + C_e)^{-1} \tag{3}$$

Here, $K_g$ is known as the Kalman gain matrix, and is of size $N_s \times N_d$, and $C_y^f$ is the covariance matrix of $y^f$. Matrix H=[0 |I], where 0 is a $N_d \times (N_s - N_d)$ matrix of zeros, and I is a $N_d \times N_d$ identity matrix. $C_e$ is the error covariance matrix of the production data d, which is usually assumed to be diagonal.

Accordingly, data measurement errors are independent of each other. From the above, it is clear that $C_y^f H^T$ is the covariance matrix of the full forecasted state vector $y^f$ with the forecasted production data d and $HC_y^f H^T$ is the covariance matrix of forecasted production data d with itself Defining the centered vectors, $\hat{y}^f = y^f - \bar{y}^f$ and $\hat{d} = d - \bar{d}$, the following is obtained:

$$C_y^f H^T = \frac{1}{M} \sum_{j=1}^{M} \hat{y}_j^f \hat{d}_j^T \qquad (4)$$

$$HC_y^f H^T = \frac{1}{M} \sum_{j=1}^{M} \hat{d}_j \hat{d}_j^T \qquad (5)$$

The final step of the EnKF is to update the state variables using the actual observations, which is given as:

$$y_j^u = y_j^f + K_g(d_{o,j} - d_j) \qquad (6)$$

Here, $d_o$ are the observed production data, and random perturbations corresponding to $C_e$ are added to $d_o$ to create the ensemble of observed data, $d_{o,j}$. The updated state vector $y^u$ thus calculated is then used to evaluate the next forecast step, and the process repeated for the next assimilation time. The EnKF methodology can be summarized as follows:

$$m_j^f \xrightarrow{f(m_j)} \begin{bmatrix} x_j \\ d_j \end{bmatrix}^f \to K_g \to y_j^u = y_j^f + K_g(d_{o,j} - d_j) \to m_j^u \qquad (7)$$

$$\forall j = 1, \ldots, M$$

EnKF with Parameterization

Parameterization of the static and dynamic variables can be used with the EnKF, for example, to increase in efficiency and robustness, handle non-Gaussian random fields, and mitigate issues with non-physical updates of dynamic and static variables. Parameterization implies the creation of a functional relationship between the concerned variables (random field) and a smaller set of preferably independent random variables. In some embodiments, a differentiable mathematical parameterization of the form $y = g(\xi)$ is obtained. Here, vector y is a realization of a discrete random field, $y \in R^{N_s}$ (Ns=EnKF state vector dimension), and vector $\xi$ (input parameters of dimension much smaller than $N_S$ is a set of independent random variables with a specified distribution (e.g., standard Gaussian). Extending the EnKF to handle parameterized static and/or dynamic variables is well known by one skilled in the art. Equation (8) shows the extension of the EnKF with parameterization only of the static variables.

$$\xi_j^f \xrightarrow{g(\xi_j)} m_j^f \xrightarrow{f(m_j)} \begin{bmatrix} x_j \\ d_j \end{bmatrix}^f \to K_g \to y_j^u = y_j^f + K_g(d_{o,j} - d_j) \to \xi_j^u \qquad (8)$$

$$\forall j = 1, \ldots, M$$

Here, the state vector of the parameterized EnKF $[\xi, x, d]^T$. Instead of directly updating the static variables m with the EnKF, the variables $\xi$ are updated and the updated variables $\xi$ are used to obtain the updated m. The conventional EnKF steps can then be followed. In the case when such a parameterization is used for honoring non-Gaussian random fields, the parameterization ensures that the updated static variables (e.g., permeability field) honor the parameterization and therefore, the statistical properties of the random field used to create the parameterization.

Additional details and examples of EnKF and EnKF derivatives (e.g., KEnKF), can be found in U.S. Pat. No. 7,584,081, U.S. patent application Ser. Nos. 12/657,929 and 13/029534, Reservoir Monitoring and Continuous Model Updating Using Ensemble Kalman Filter (Naevdal, G., Johnsen, L. M., Aanonsen, S. I., Vefring, E. H., SPE paper 84372 presented at the SPE Annual Technical Conference and Exhibition, Denver, Colo., 2003), and Real-time Reservoir Model Updating Using Ensemble Kalman Filter (Wen, X.-H., Chen, W. H., SPE 92991 presented at the SPE Reservoir Simulation Symposium, Houston, Tex., 2005), which are incorporated herein by reference.

Subspace EnKF Formulation

The subspace EnKF generalizes the parameterized EnKF by allowing the parameterization of each ensemble member to be different from each other. That is, for each ensemble member:

$$m_j = g^j(\xi_j) \; \forall j = 1, \ldots, M \qquad (9)$$

Thus, each ensemble member can belong to different random fields, or can be constrained to different subspaces of the same random field depending on the nature of the parameterization. The different parameterizations ensure that each updated ensemble member honors the statistics of the random field from which it was generated, or constrains the updated variables to lie within the specific subspaces.

$$\xi_j^f \xrightarrow{g^j(\xi_j)} m_j^f \xrightarrow{f(m_j)} \begin{bmatrix} x_j \\ d_j \end{bmatrix}^f \to K_g \to y_j^u = y_j^f + K_g(d_{o,j} - d_j) \to \xi_j^u \qquad (10)$$

$$\forall j = 1, \ldots, M$$

The EnKF equations cannot be applied as is if the parameterization is different for different ensemble members. This is because the EnKF equations are only valid if the forward model relating the static variables ($\xi$) to the dynamic (x, d) for each member is the same. In order to mitigate this problem, it is realized that the Kalman update equation is similar to the steepest descent equation with the step length set to 1. Thus, as is well known, the Kalman update is an approximation to the gradient of the least-square error with respect to the state variables of the EnKF:

$$\frac{dE}{dy_j} \square K_g(d_{o,j} - d_j) \;\; \text{or} \;\; \frac{dE}{dm_j} \square K_g(d_{o,j} - d_j) \bigg|_{1:N_m} \qquad (11)$$

Once m is obtained from $g(\xi)$, the exact parameterization is irrelevant for the calculation of dE/dm, as the calculation of dE/dm does not involve $\xi$ or $g(\xi)$. Therefore, dE/dm can be evaluated correctly even if different parameterizations are used for the different ensemble members; however, the same cannot be said for $dE/d\xi$. Thus, in order to obtain, $dE/d\xi$, the ubiquitous chain rule can be used.

$$\frac{dE}{d\xi_j} = \frac{dm_j}{d\xi_j} \frac{dE}{dm_j} \qquad (12)$$

$$= \frac{dg^j(\xi)}{d\xi_j} \frac{dE}{dm_j}$$

-continued $$= \frac{dg^j(\xi)}{d\xi_j} K_g(d_{o,j} - d_j) \bigg|_{1:N_m}$$

Equation (12) can be used to obtain the updated $\xi$. Notice that although dE/dm lies in the same subspace for each ensemble member (i.e., subspace spanned by the columns of $K_g$) dE/d$\xi$ can be quite different and belong to different subspaces due to the different parameterizations.

$$\xi_j^u = \xi_j^f + \frac{dg^j(\xi)}{d\xi_j^f} K_g(d_{o,j} - d_j) \bigg|_{1:N_m} \quad (13)$$

$$\forall j = 1, \ldots, M$$

Once $\xi_j^u$ is obtained, $m_j^u$ can be obtained using equation (9). Therefore the final Kalman update equation for m can be written as follows:

$$m_j^u = g^j\left(\xi_j^f + \frac{dg^j(\xi)}{d\xi_j^f} K_g(d_{o,j} - d_j) \bigg|_{1:N_m}\right) \quad (14)$$

$$\forall j = 1, \ldots, M$$

The Kalman update equation for the dynamic variables remains the same as the standard EnKF if no parameterization is used for them.

Subspace EnKF with K-L Expansion

The subspace EnKF for the well known Karhunen-Loeve expansion can be derived as the parameterization function g ($\xi$). The Karhunen-Loeve expansion is a powerful tool for representing stationary and non-stationary random fields (or processes) with explicitly known covariance functions. It allows representing any random field or process as a series expansion involving a complete set of deterministic functions with corresponding random coefficients, which can be used as a differentiable parameterization of the random field. This method provides a second-moment characterization (2-point statistics) in terms of random variables and deterministic functions. The use of the K-L expansion with orthogonal deterministic basis functions and uncorrelated random coefficients has generated interest because of its bi-orthogonality property. Accordingly, both the deterministic basis functions (eigenfunctions) and the corresponding random coefficients are orthogonal. This allows for an optimal encapsulation of the information contained in a multi-Gaussian random process into a set of independent random variables. The discrete K-L expansion for a given covariance matrix C is given as:

$$y = E\Lambda^{1/2}\xi = \Phi\xi \equiv y = g(\xi) \quad (15)$$

Here, E is the matrix of eigenvectors of the covariance matrix C, $\Lambda$ is a diagonal matrix of the eigenvalues of C, and $\xi$ (vector) is a set of uncorrelated random variables. These random variables are also independent if the random field is multi-Gaussian. Therefore, if the elements of $\xi$ are drawn from the standard Gaussian distribution, the y obtained using Equation (15) will be multi-Gaussian correlated with covariance C. Thus, the K-L expansion can be used for simulation of multi-Gaussian random fields. On the other hand, if the covariance matrix C is obtained from a set of realizations having higher order statistics, Equation (15) can still be used to obtain realizations y, but those realizations will only have the same covariance C as the original realizations used to calculate C. The higher order moments in the original realizations will in general not be reproduced.

The K-L expansion is thus a parameterization of the form y=g($\xi$) where the functional relationship is linear. Here, matrix C is of size Ns×Ns. The maximum size of the matrices E and $\Lambda$ is Ns×Ns, and that of vector $\xi$ is Ns×1. Note that the word maximum is used because we may choose to retain only the largest $N_K$ of the total $N_S$ eigenvalues, in which case E is of size Ns×$N_K$, $\Lambda$ is of size $N_K$×$N_K$, and $\xi$ is of size $N_K$×1. Thus, the random field y is parameterized in terms of $N_K$ independent random variables $\xi$.

If the K-L expansion of equation (15) is used as the parameterization function, then equation (14) is reduced to the following:

$$m_j^u = m_j^f + \Phi_j \Phi_j^T K_g(d_{o,j} - d_j)|_{1:N_m} \forall j = 1, \ldots, M \quad (16)$$

If $\Phi$ is full rank, then $\Phi\Phi^T$ is the identity matrix, which reverts back to the standard Kalman update equation. However, $\Phi$ is usually obtained from covariance matrices obtained from a small number of realizations of the random field, and thus has a much smaller rank. Furthermore, if each ensemble member has a different low rank $\Phi$, then each updated ensemble member is constrained to a small subspace of the full space of m.

Subspace EnKF with Kernel PCA Parameterization

As described above, standard principal component analysis (PCA) or the K-L expansion is appropriate for multi-Gaussian random fields. However, most real geological systems (e.g., channels, deltaic fans) are usually non-Gaussian, limiting the applicability of the K-L expansion. To mitigate this problem, kernel methods can be used to create nonlinear, non-Gaussian generalizations of PCA, which can then be used to parameterize non-Gaussian random fields. In particular, polynomial kernels of higher orders can be applied to perform the K-L expansion not in the original space of the realizations $R^{Nc}$, but in a high order space called feature space F. The introduction of the feature space acts to preserve higher order moments (i.e., multipoint statistics) rather than just the second moment (i.e., two-point statistics). Since the feature space F is nonlinearly related to the original space $R^{Nc}$, the overall approach is essentially a form of nonlinear PCA.

Figure 1B:
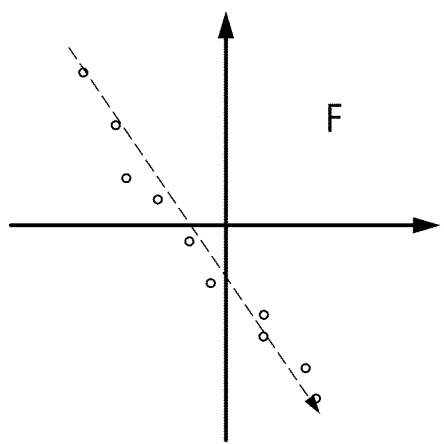

FIGS. 1A and 1B demonstrate the basic idea behind nonlinear kernel PCA. Consider an arbitrary random field in $R^2$ ($N_C$=2). In other words, each realization is a vector of dimension two, $y=(y_1, y_2)^T$. Each realization, which are nonlinearly related to each other, can thus be plotted as a point on a 2-D graph, as shown in FIG. 1A. However, if linear PCA or the standard Karhunen-Loeve expansion are used, the major principal component obtained is in the direction drawn as an arrow in the graph. Thus, linear PCA is clearly unable to capture the nonlinear relationship among the realizations. In other words, the Karhunen-Loeve expansion is only able to represent linear relationships among the realizations in the space where it is performed, in this case $R^2$. Now, consider a nonlinear mapping $\Phi$ that relates the input space $R^{Nc}$ to feature space F. This can be written as:

$$\Phi: R^{Nc} \to F; Y = \Phi(y); y \in R^{Nc}, Y \in F \quad (17)$$

Here, F can have an arbitrarily large dimensionality. As seen in FIG. 1B, after this $\Phi$ transform, the realizations that were nonlinearly related in $R^2$ become linearly related in F. Thus, standard linear PCA (i.e., K-L expansion) can now be performed in F in order to determine the eigenvectors in this space.

Realizing that nonlinear kernel PCA is essentially linear PCA in a high dimensional feature space (as opposed to the input space $R^{Nc}$), an eigenvalue problem similar to standard PCA can be formulated in the feature space F. Additionally, because the covariance matrix in feature space can be very large and intractable, instead an equivalent eigenvalue problem of a much smaller kernel matrix K can be performed. Here, kernel matrix K is defined as:

$$K: K_{ij} = (\Phi(y_i) \cdot \Phi(y_j)) \tag{18}$$

Each element of the kernel matrix is a dot product of vectors in F, and not the dot product of vectors in the input space of the realizations, $R^{N_c}$. The dimension of the kernel matrix is $N_R \times N_R$ ($N_R$=number of realizations), and therefore, its eigen-decomposition can still be performed very efficiently. Because only the dot products in the space F are used for application of kernel PCA, and not $\Phi(y)$ itself, the components of K can be calculated directly (and very efficiently) using what is known as a kernel function, k ($y_1$, $y_2$):

$$(\Phi(y_1) \cdot \Phi(y_2)) = k(y_1, y_2) \tag{19}$$

The following polynomial kernel can be used to preserve high order statistics:

$$(\Phi(y_1) \cdot \Phi(y_2)) = k(y_1, y_2) = \sum_{i=1}^{d} (y_1 \cdot y_2)^i \tag{20}$$

Here d is a positive integer. The case of d=1 is equivalent to linear PCA. Accordingly, the feature space is the same as $R^{N_c}$ and two-point statistics will be preserved. However, for larger values of d, all moments up to the $2d^{th}$ order moment (2d order statistics) are preserved.

Because in kernel PCA, the K-L expansion is performed in the high order feature space, the results of the K-L expansion (realizations) thus lie in the feature space (i.e., a simulated realization $Y \in F$). However, since the goal is to obtain a parameterization of this input random field, there is interest in obtaining realizations in the original space of the input random field $R^{N_c}$. This can be obtained by solving what is known as a pre-image problem. The final parameterization obtained by solving the pre-image problem for the kernel of Equation Error! Reference source not found. is given as:

$$g(y, \xi) = \sum_{k=1}^{d} k(y \cdot y)^{k-1} y - \sum_{i=1}^{N_R} \beta_i \sum_{k=1}^{d} k(y_i \cdot y)^{k-1} y_i = 0 \tag{21}$$

This representation is very useful as it is a continuously differentiable parameterization relating a realization y in the input space $R^{N_c}$ to a set of independent random variables $\xi$. Here, $\beta_i$ are functions of $\xi$. Unlike the standard K-L expansion, however, this is an implicit nonlinear parameterization, and the gradient of y with respect to $\xi$ required for the subspace formulation can be obtained by setting dg=0.

$$\frac{dy}{d\xi} = -\left(\frac{\partial g}{\partial y}\right)^{-1} \frac{\partial g}{\partial \xi} \tag{22}$$

Note that the subspace formulation with an implicit parameterization of the form g ($y, \xi$)=0 is given by:

$$\xi_j^u = \xi_j^f + \left(\frac{\partial g^j}{\partial y_j^f}\right)^{-1} \left(\frac{\partial g^j}{\partial \xi_j^f}\right) K_g(d_{o,j} - d_j)\bigg|_{1:N_m} \tag{23}$$

$$\forall j = 1, \ldots, M$$

After the updated $\xi_j^u$ is obtained, the updated $y_j^u$ is obtained by solving g ($y^u, \xi^u$)=0. This is done using fixed point iteration with relaxation:

$$y_j^{u,n+1} = \frac{\theta}{1+\theta} y^{u,n} + \frac{1}{1+\theta} \frac{\sum_{i=1}^{N_R} \beta_{ij} \sum_{k=1}^{d} (y_i^f \cdot y^{u,n})^{k-1} y_i^f}{\sum_{k=1}^{d} k(y^{u,n} \cdot y^{u,n})^{k-1}} \tag{24}$$

$$\forall j = 1, \ldots, M$$

Example Application of the Subspace EnKF

A 2D 2-phase synthetic model is chosen for validation of the subspace EnKF. The first example demonstrates application of the subspace EnKF with the standard PCA parameterization, and the second example demonstrates application of the subspace formulation with an iterative EnS and kernel PCA parameterization.

Figure 2:
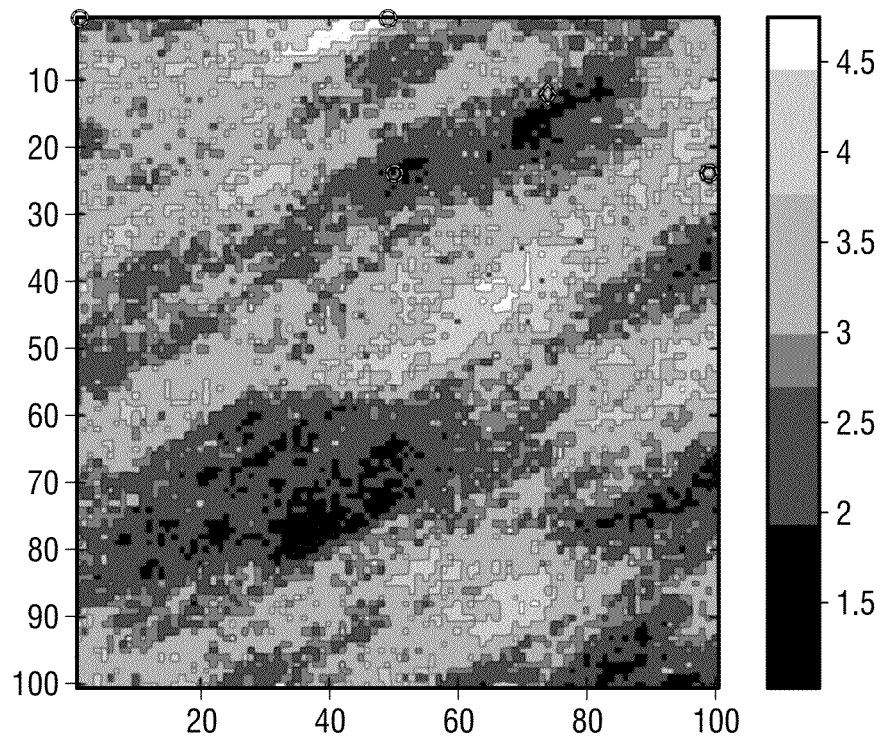
FIG. 2 shows a synthetic 2D 2-phase model shown with true log permeability field, 4 producers (circles) and 1 injector (diamond).

In the first example, the model consists of 100×100 cells and 4 producers and one water injector are present in one corner of the reservoir as shown in FIG. 2. For the purpose of data assimilation, all properties of the reservoir are assumed to be known except the permeability field, and the true permeability field is also shown is FIG. 2. This permeability field is multi-Gaussian and has a correlation length of 15 grids in one direction and 50 in the other and the anisotropy angle is 25 degrees. The observed data used for assimilation is the oil and water production rates and the injection BHPs. Standard normal noise with a standard deviation of 10% is added to the observed data to mimic reality.

Figure 4:
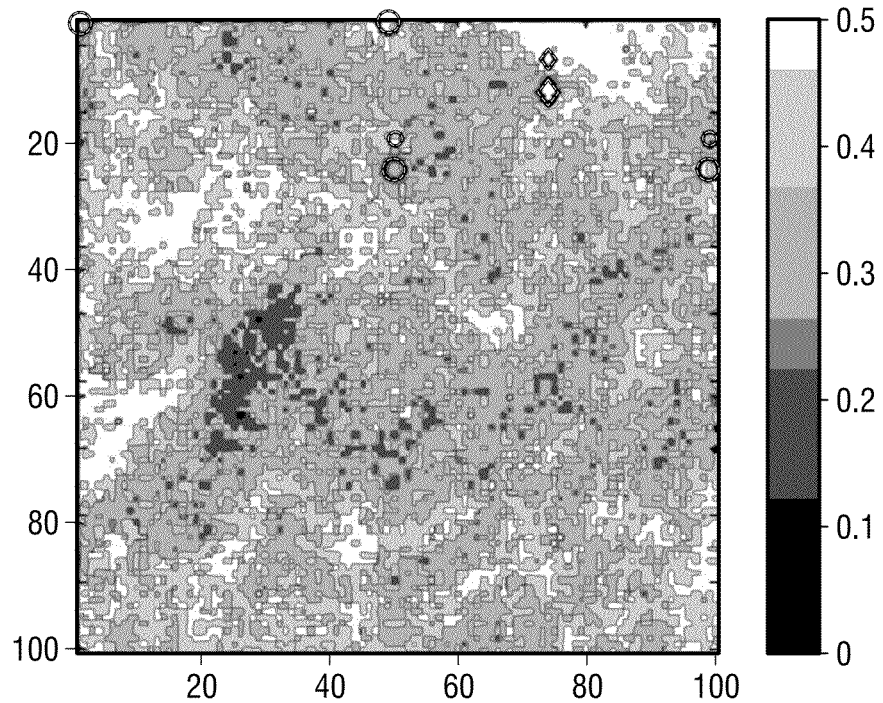
FIG. 4 shows variance of log permeability of an initial ensemble.
Figure 3A:
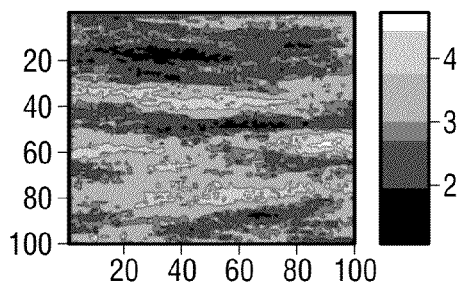
FIGS. 3A-3J show 10 initial ensemble members (log permeability) of the standard EnKF, each having a different correlation length and different anisotropy direction.
Figure 3B:
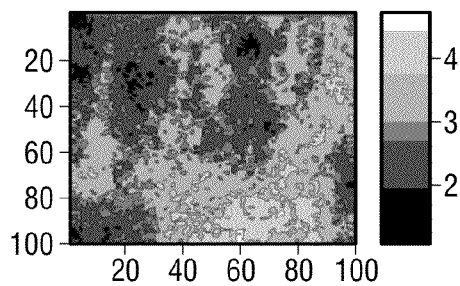
Figure 3C:
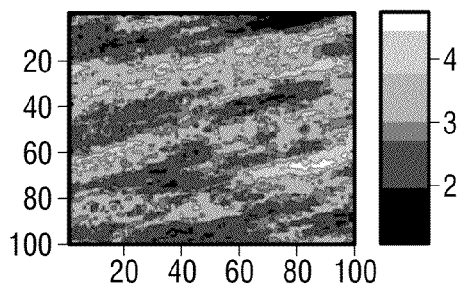
Figure 3D:
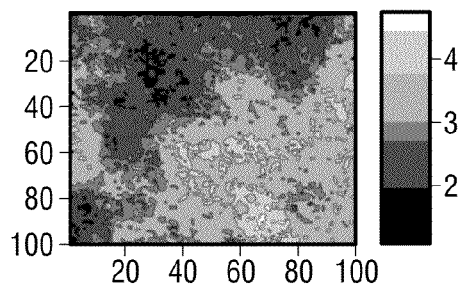
Figure 3E:
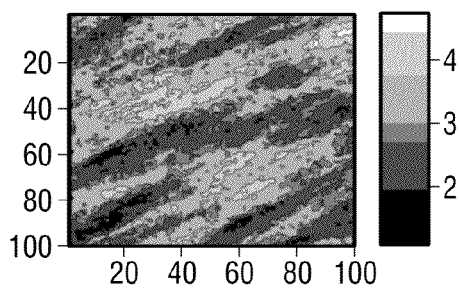
Figure 3F:
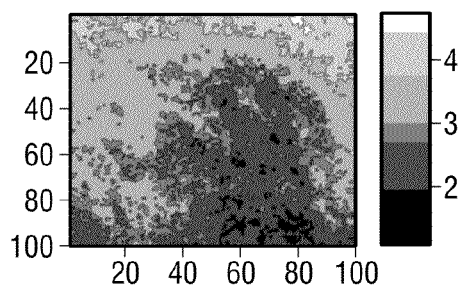
Figure 3G:
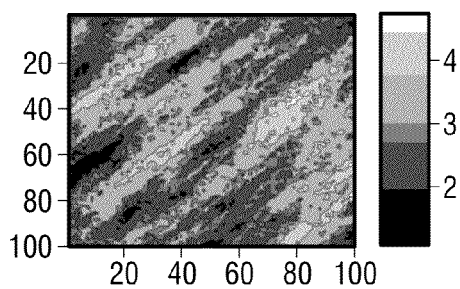
Figure 3H:
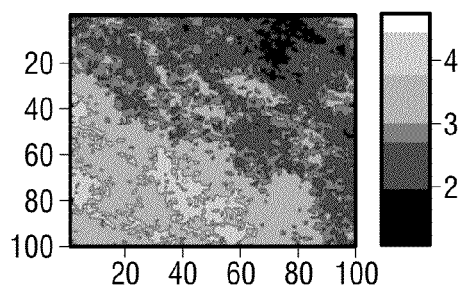
Figure 3I:
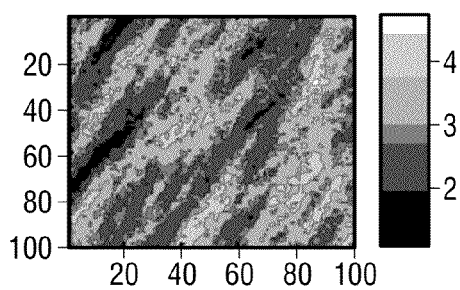
Figure 3J:
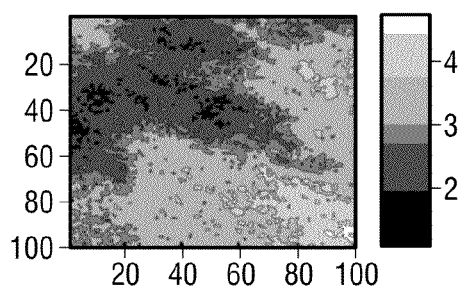
Figure 6A:
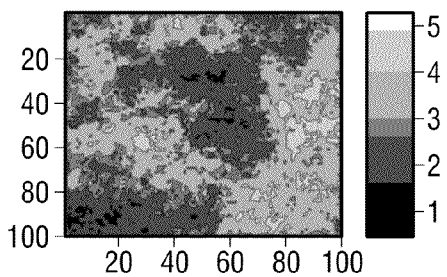
FIGS. 6A-6J show 10 ensemble members of the final ensemble of the standard EnKF after 10 updates.
Figure 6B:
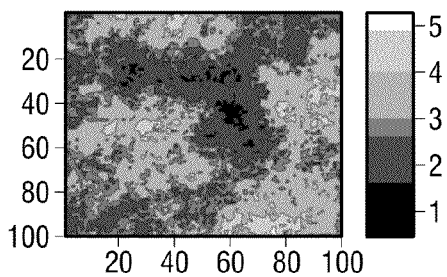
Figure 6C:
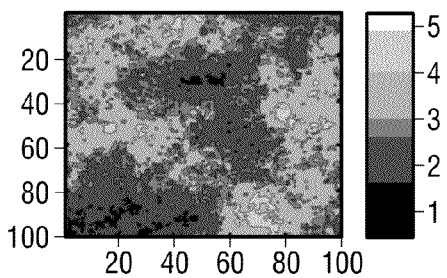
Figure 6D:
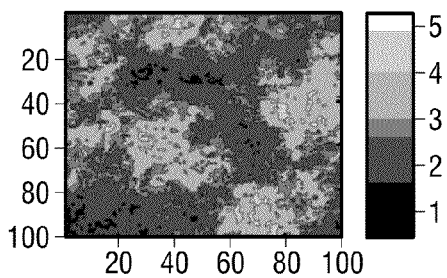
Figure 6E:
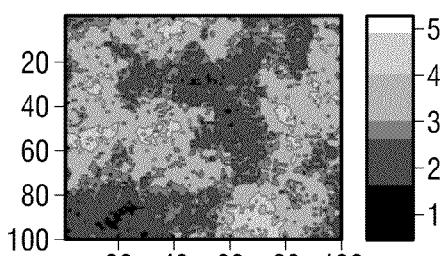
Figure 6F:
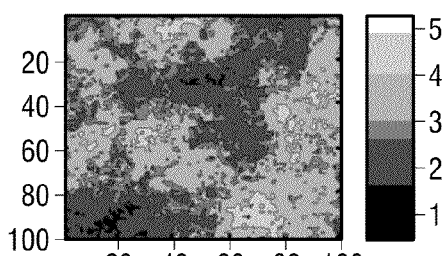
Figure 6G:
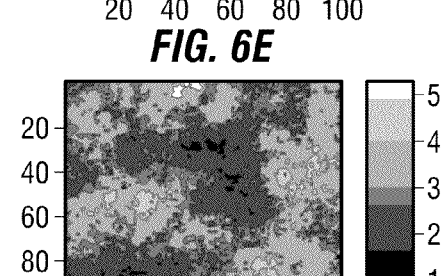
Figure 6H:
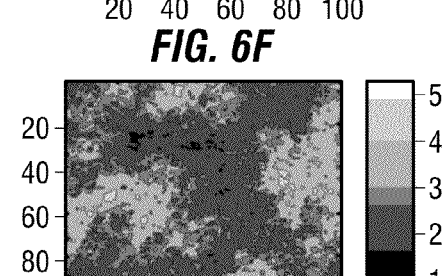
Figure 6I:
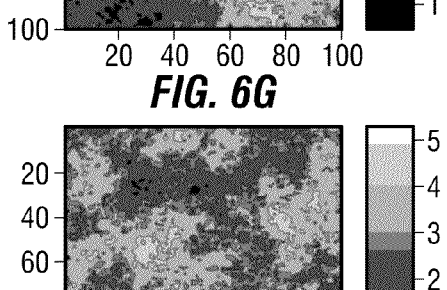
Figure 6J:
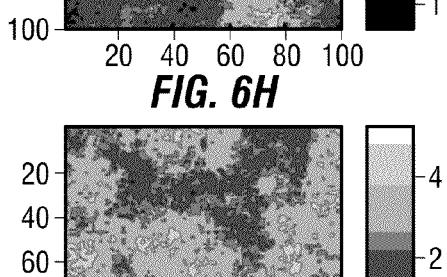
Figure 7:
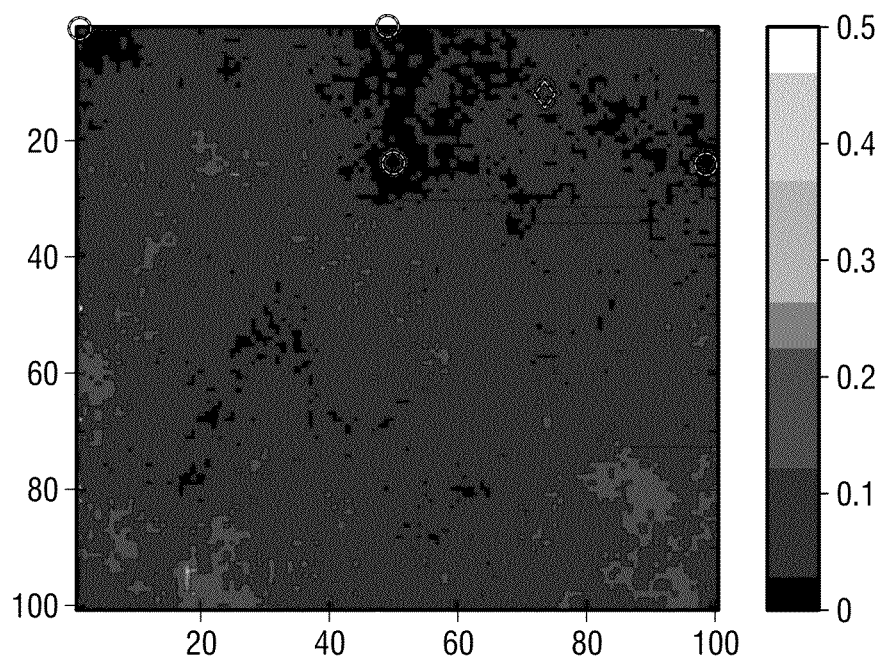
FIG. 7 shows variance of log permeability of the final ensemble of the standard EnKF.
Figure 8A:
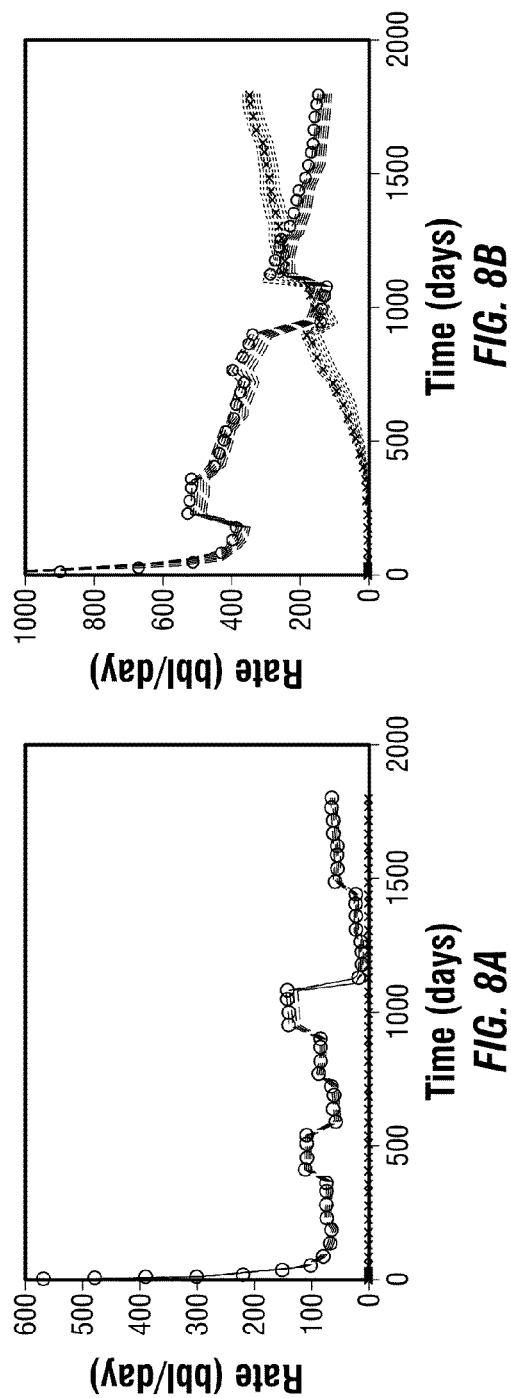
FIGS. 8A-8D show oil and water production rates of a final ensemble for the 4 producers, and the observed rates (circles for oil and X's for water) for the standard EnKF.
Figure 8B:
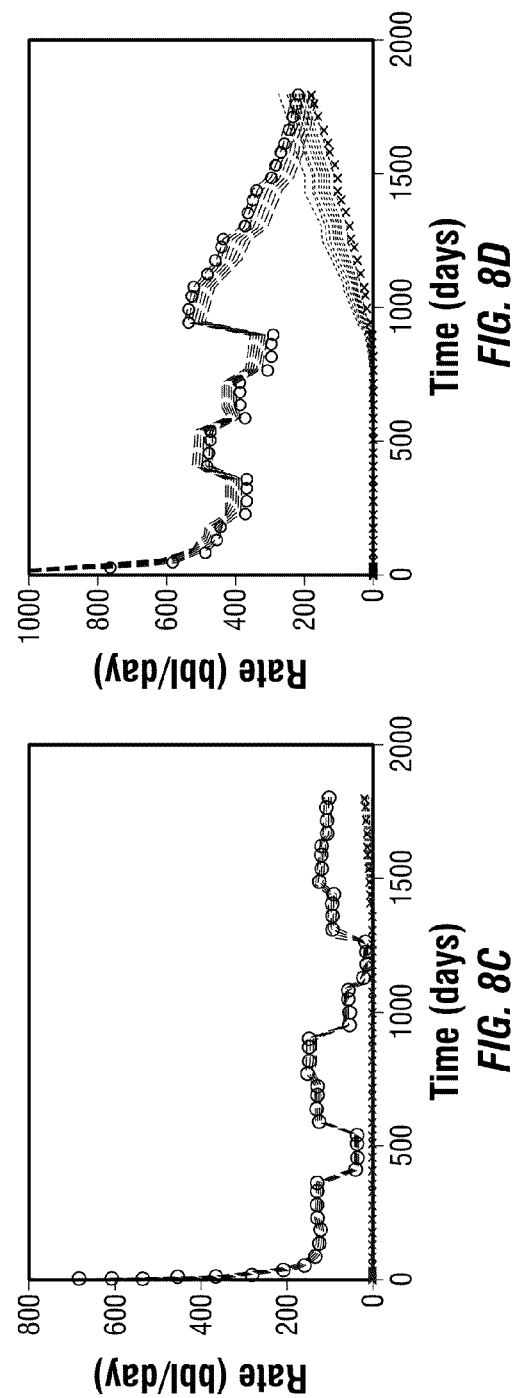
Figure 8C:
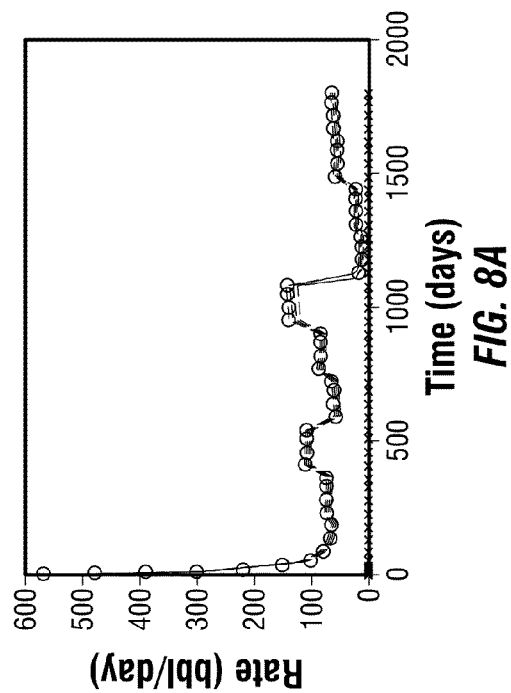
Figure 8D:
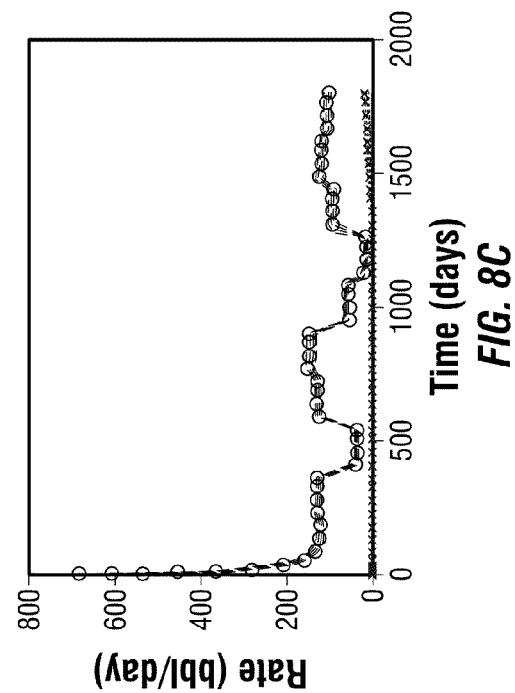
Figure 9A:
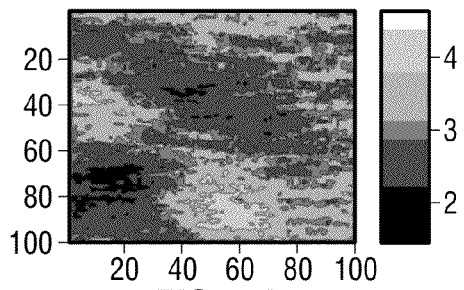
FIGS. 9A-9J show 10 ensemble members of the final ensemble of the subspace EnKF after 10 updates.
Figure 9B:
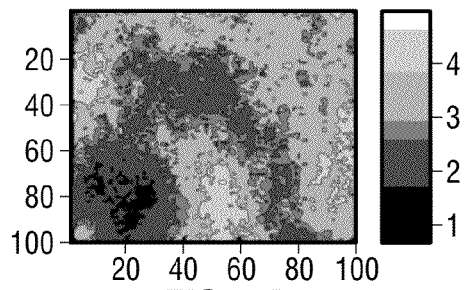
Figure 9C:
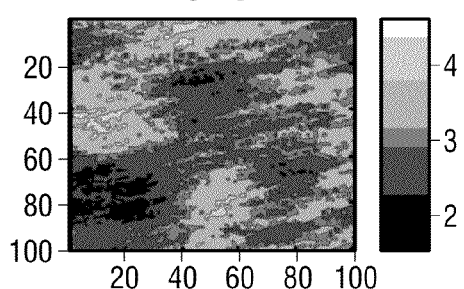
Figure 9D:
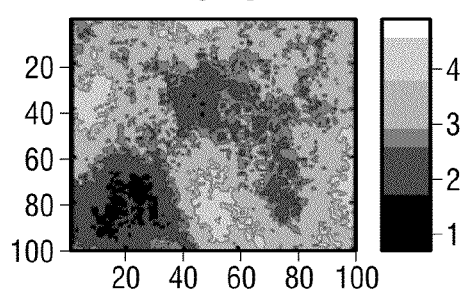
Figure 9E:
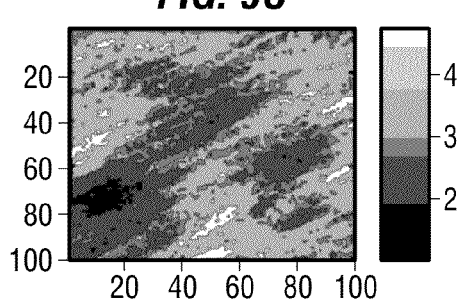
Figure 9F:
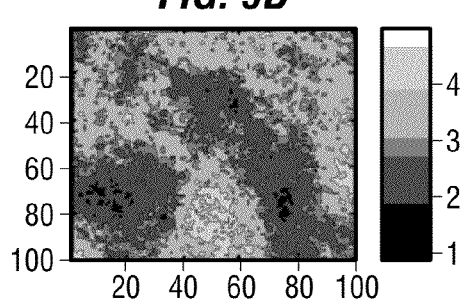
Figure 9G:
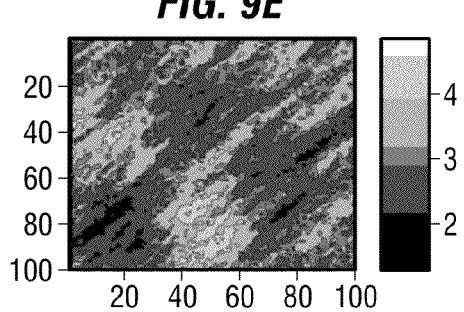
Figure 9H:
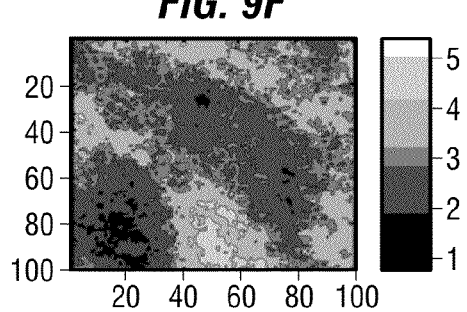
Figure 9I:
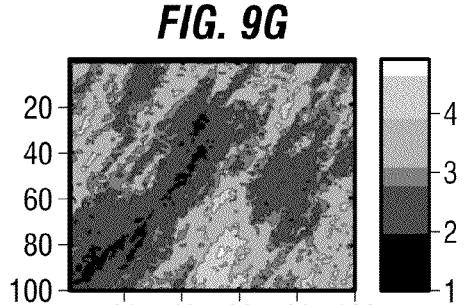
Figure 9J:
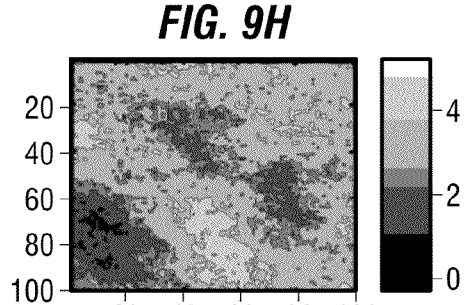

Ten (10) members of the initial 35 member ensemble for the standard EnKF is shown in FIGS. 3A-3J. No information about the true permeability field except that it is multi-Gaussian is assumed to be known apriori. Therefore, the 35 members of the initial ensemble are generated using correlation lengths varying from 10 to 90 grids and anisotropy angles varying from 0 to 90 degrees. FIG. 4 shows the variance of log permeability across the initial ensemble. FIGS. 5A-5D show the oil and water production rates for the initial ensemble. Clearly, it has a large spread and encompasses the observed data well. FIGS. 6A-6J show 10 ensemble members of the final ensemble of the standard EnKF. All the different anisotropy angles and correlations lengths of the initial ensemble are no longer visible in the final ensemble, and the ensemble has collapsed with all ensemble members looking essentially the same. Ensemble collapse can also be verified from FIG. 7, which shows that the variance across the final ensemble members is close to zero, even far away from the wells. This clearly demonstrates that such as ensemble, although providing a good match to the data (FIGS. 8A-8D), would do poorly in predictions far away from the wells.

Figure 10:
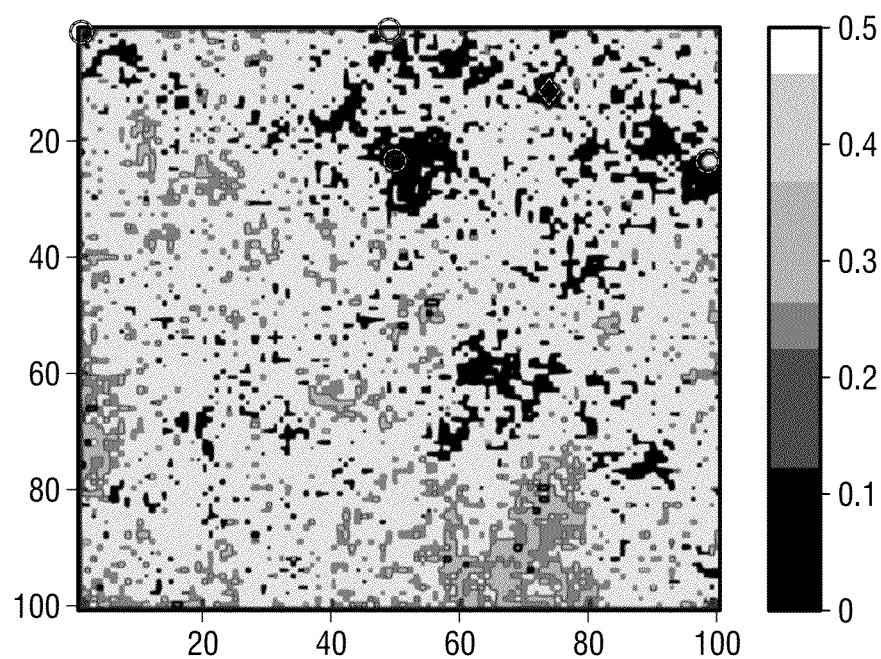
FIG. 10 shows variance of log permeability of the final ensemble of the subspace EnKF.

FIGS. 9A-9J show 10 members of the final ensemble obtained with the subspace EnKF. It is clear that these ensemble members retain the anisotropy angle and correlation lengths of the initial ensemble, and the variance across the ensemble, although small near the wells as expected, is larger away from the wells (FIG. 10), and thus should provide better predictions away from the wells. FIGS. 11A-11D show the oil and water production rates for the final ensemble from the subspace EnKF. Although the data match is not as good as the standard EnKF, it is acceptable and is much better than the initial ensemble. The reason why the match is not as good as the standard EnKF is that, unlike the standard EnKF, where all ensemble members converge toward the best matching ensemble member, in the subspace EnKF, because each member is constrained to a subspace, they cannot converge to a best matching ensemble member, but can only converge toward solutions that best match the data within their own subspaces. This also implies that some members may not provide an acceptable data match if no such solutions exist within their subspace. This indicates that the geological model that the subspace represents is not acceptable and thus, provides a way to discard prior geological models that are not probable.

Figure 12:
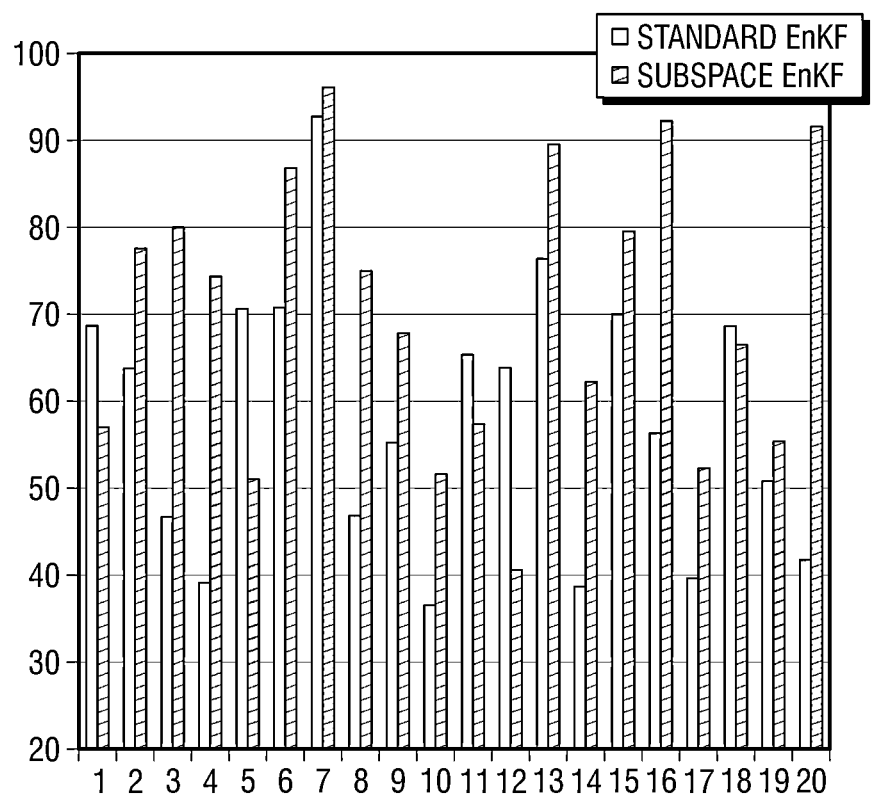
FIG. 12 shows the percentage of time the true production rates are within the predicted rates for 20 different random well placements.
Figure 13A:
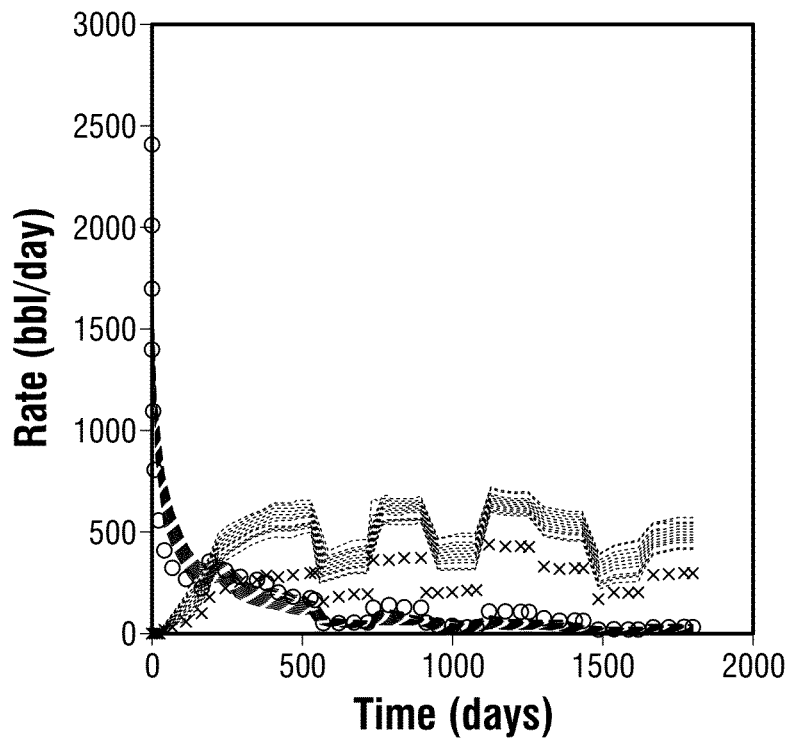
FIGS. 13A-13D show oil and water production rates predicted for the 4 producers for a random well placement, and the observed rates (circles for oil and X's for water) for the standard EnKF.
Figure 13B:
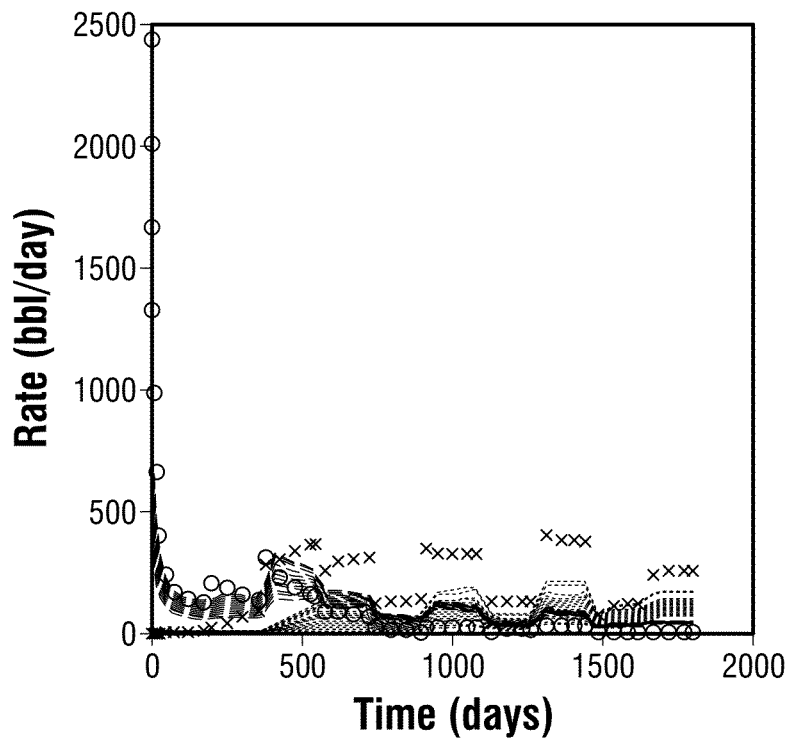
Figure 13C:
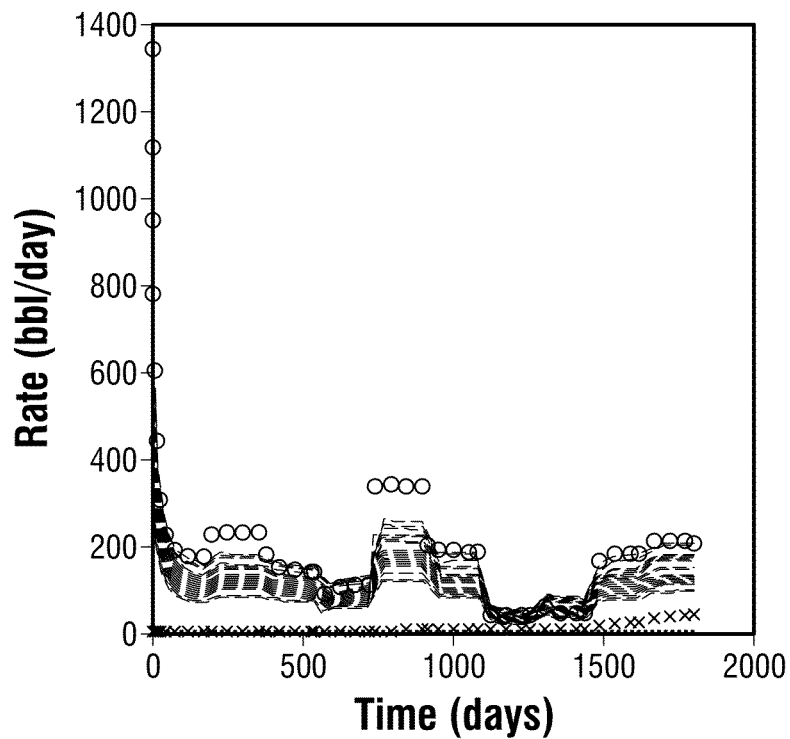
Figure 13D:
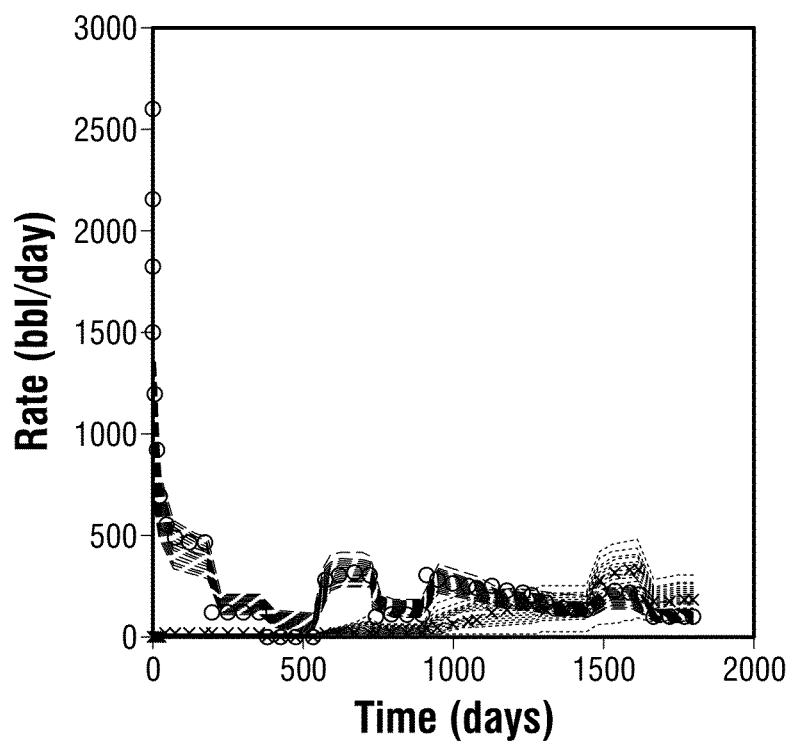
Figure 14A:
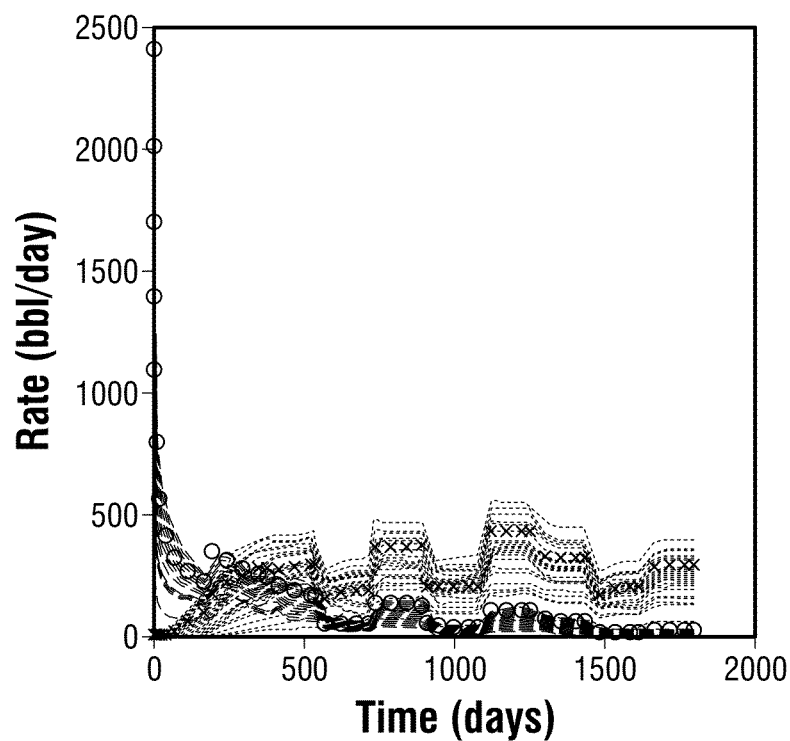
FIGS. 14A-14D show oil and water production rates predicted for the 4 producers for a random well placement, and the observed rates (circles for oil and X's for water) for the subspace EnKF.
Figure 14B:
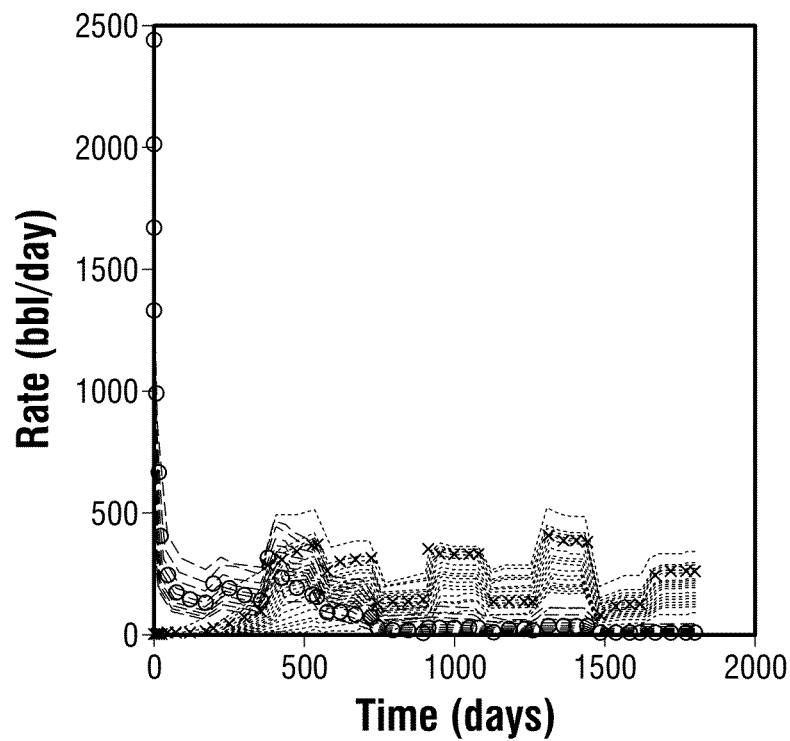
Figure 14C:
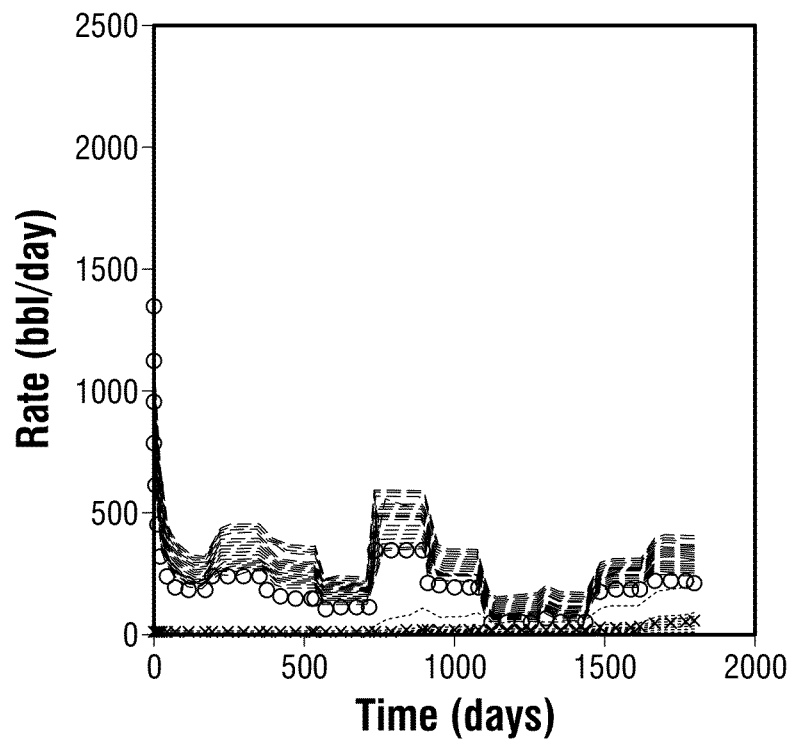
Figure 14D:
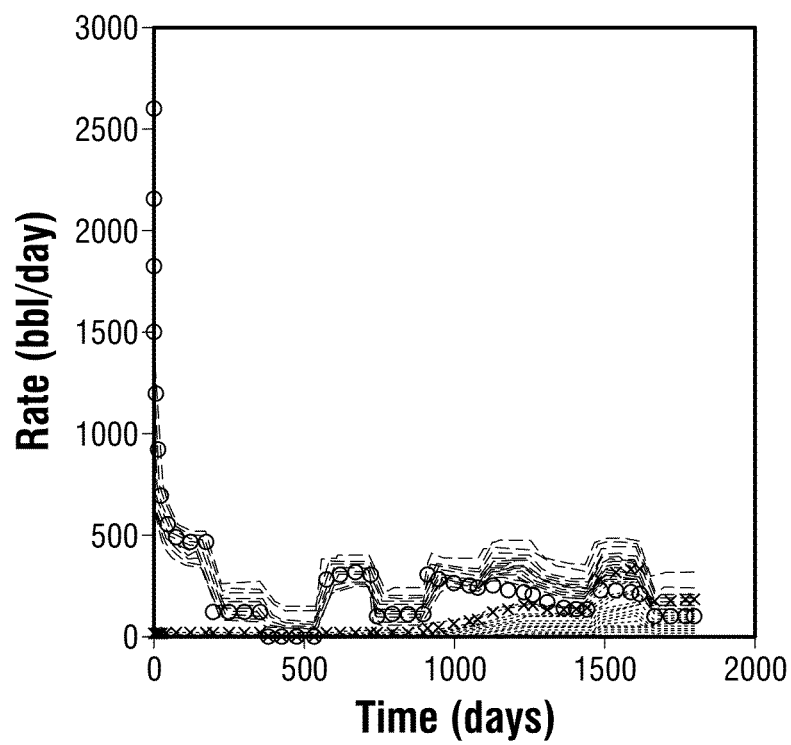

As mentioned earlier, the purpose of history-matching is not only matching the observed data, but more importantly to provide good predictions of future production. To test the predictive capacity of the standard EnKF vs. the subspace EnKF, the 5 wells are now removed from their original locations and randomly placed throughout the reservoir. Their production rates from the final ensembles for both approaches are then compared to the productions rates from the true permeability field for the same well locations and schedules. The metric chosen to compare the predictive capacity is the percentage of time the true production rates lie within the range predicted by the ensemble. This test in done 20 times for different random well locations, and the results are shown in FIG. 12. It is clear that the subspace EnKF does better in 75% of the cases, which is significantly better than the standard EnKF. Overall, the true production rates lie within the predicted production rates 71% of the time on an average for the subspace EnKF, and only 58% of the time for the standard EnKF. FIGS. 13A-13D and 14A-14D show the predicted production rates and the true production rates for a typical case for the standard and subspace EnKF.

Figure 15:
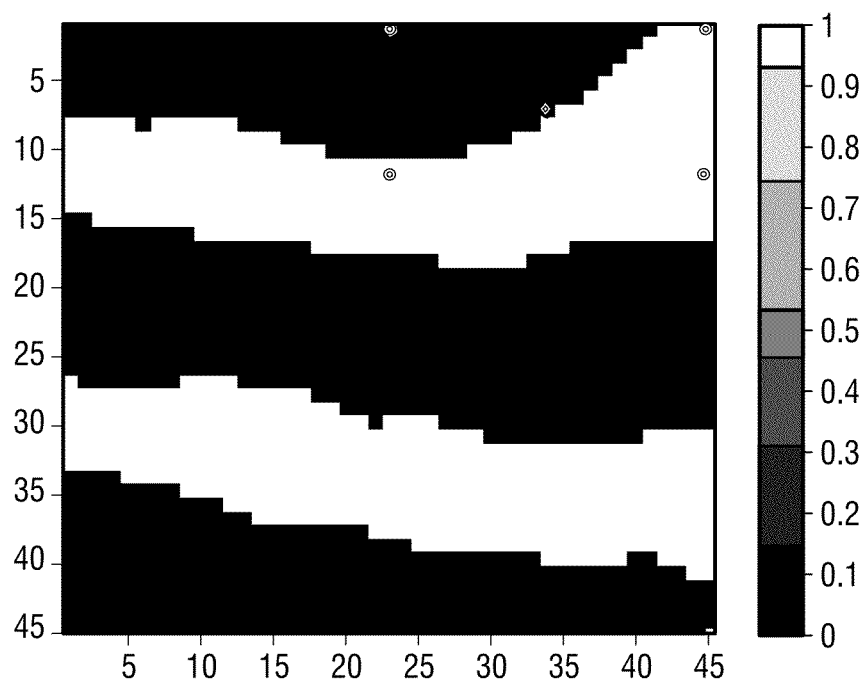
FIG. 15 shows a synthetic 2D 2-phase model shown with true permeability field (channels), 4 producers (black circles) and 1 injector (black diamond)
Figure 16:
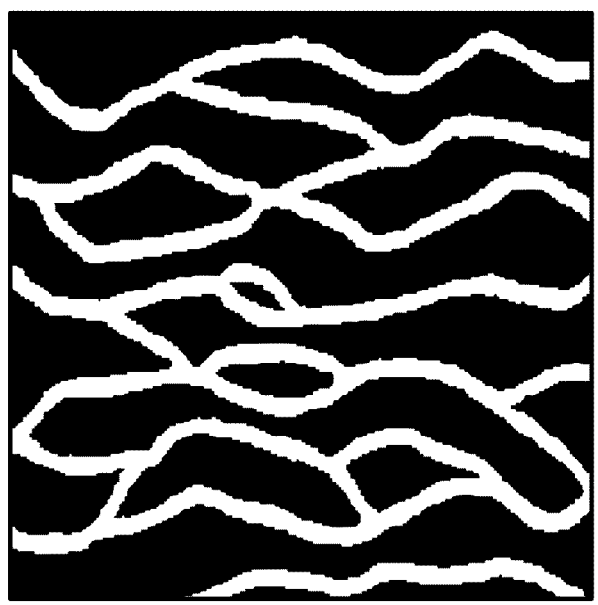
FIG. 16 shows a channel training image used to create the original realizations.
Figure 17A:
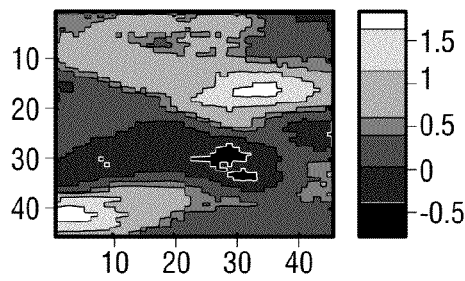
FIGS. 17A-17J show initial ensemble members (permeability) for the iterative EnS with PCA parameterization.
Figure 17B:
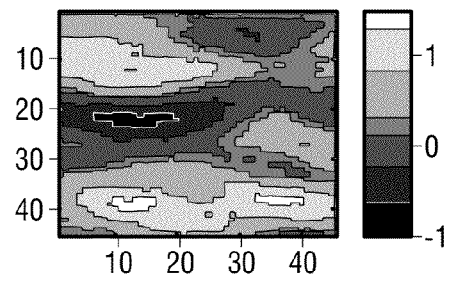
Figure 17C:
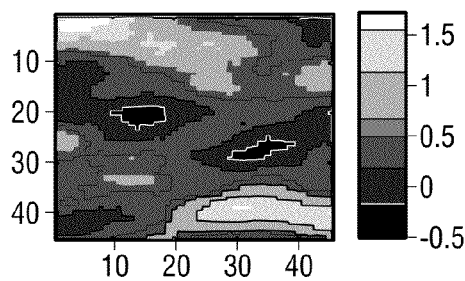
Figure 17D:
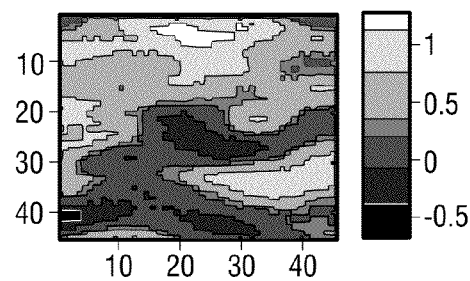
Figure 17E:
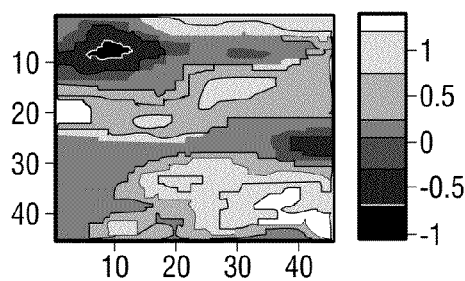
Figure 17F:
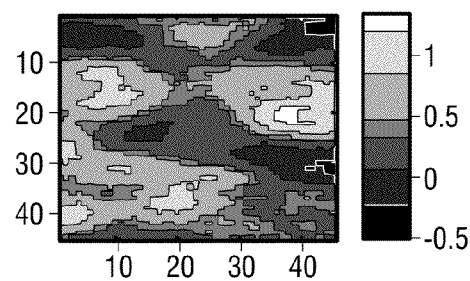
Figure 17G:
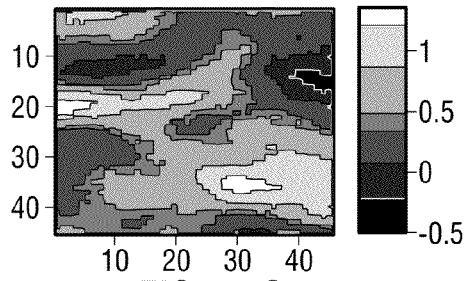
Figure 17H:
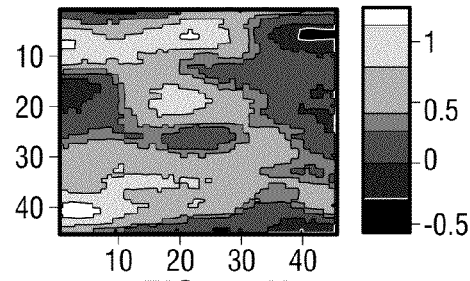
Figure 17I:
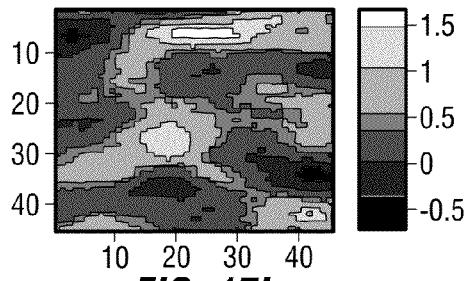
Figure 17J:
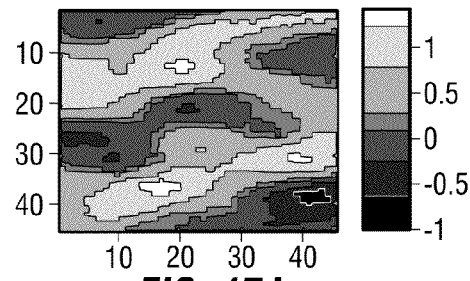

The second example is similar to the first except that the permeability field is a non-Gaussian channel sand as seen in FIG. 15, with the sand permeability being about 10 D and the background permeability about 500 mD. The contrast in permeability between the high permeability sand and the background reservoir is about a factor of 20. The reservoir is modeled by a 45×45×1 horizontal 2D grid. It is essentially an incompressible two-phase unit mobility oil-water system, with zero connate water saturation and zero residual oil saturation. The model is run for 900 days with 1 injector well under rate control and 4 producer wells under bottom hole pressure (BHP) control with predefined rates and BHPs. The objective, like the first example, is to estimate the unknown permeability field using observed data that consists of the injector BHPs and oil and water production rates. Standard normal noise with a standard deviation of 10% is added to the observed data to mimic reality. Although the permeability field is assumed unknown for the purpose of this study, prior geological knowledge indicates that this is a fluvial channelized reservoir, as shown in the training image in FIG. 16. Geostatistical software snesim is used to create 2400 realizations of the permeability field using this training image. Because the KPCA parameterization can be very nonlinear, to obtain a better match to the historical data, an iterative ensemble smoother (EnS) is used instead of the EnKF. The iterative EnS is essentially application of the EnS on the same data multiple times with different initial ensembles, which is very similar to a steepest descent algorithm with step length equal to 1 and an average gradient estimated from the ensemble. Note that a is set to 1 for all iterations as varying a or having a different than 1 did not improve results. The ensemble size is set to 40 is all of the experiments below and the number of EnS iterations is set to 5.

Figure 18:
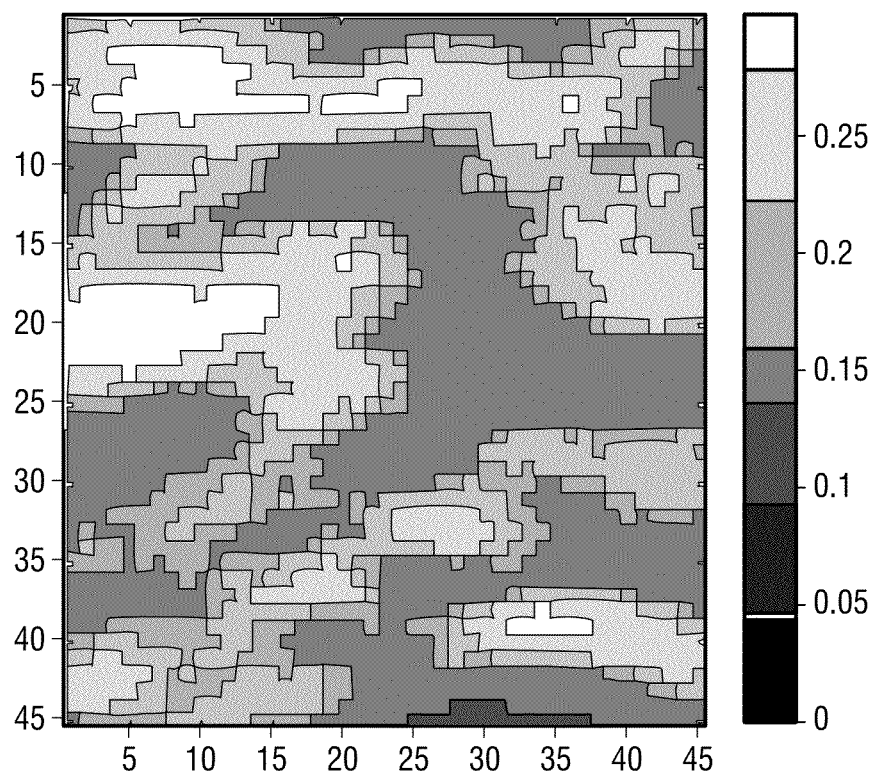
FIG. 18 shows variance of permeability of the initial ensemble of the iterative EnS with PCA parameterization.
Figure 19A:
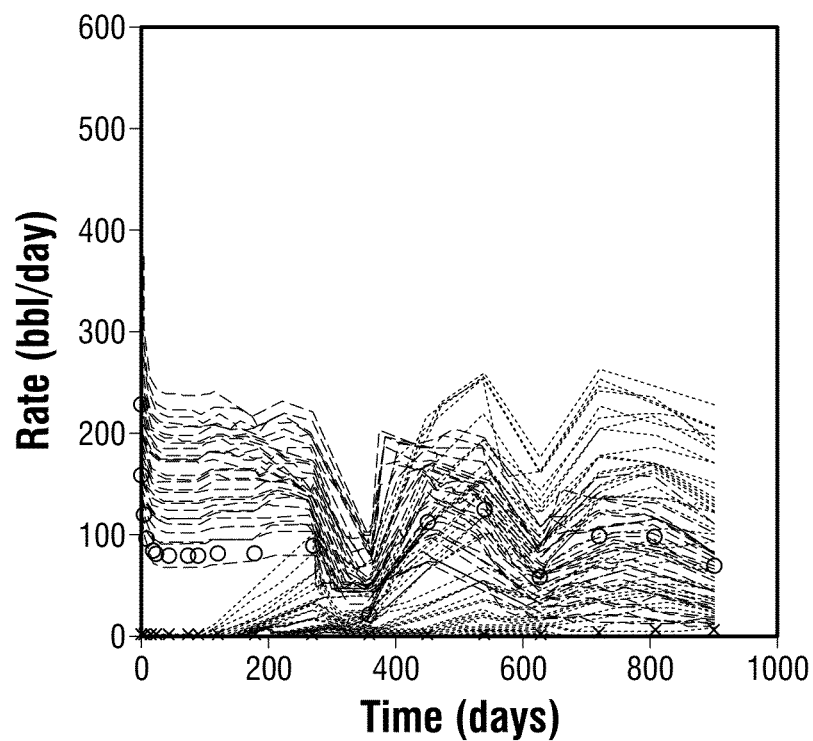
FIGS. 19A-19D show oil and water production rates of the initial ensemble for the 4 producers, and the observed rates (circles for oil and X's for water) for the iterative EnS with PCA parameterization.
Figure 19B:
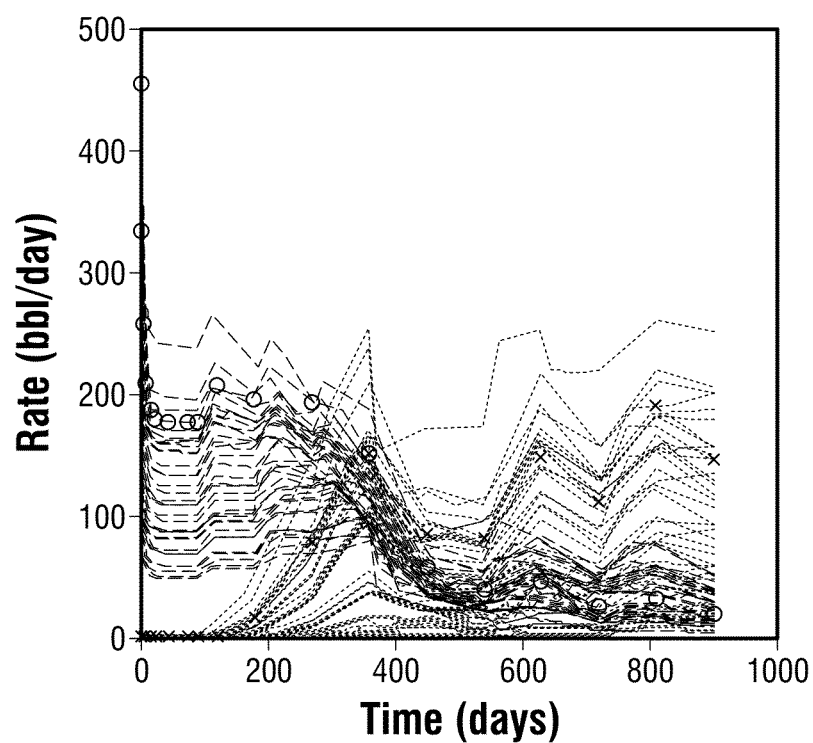
Figure 19C:
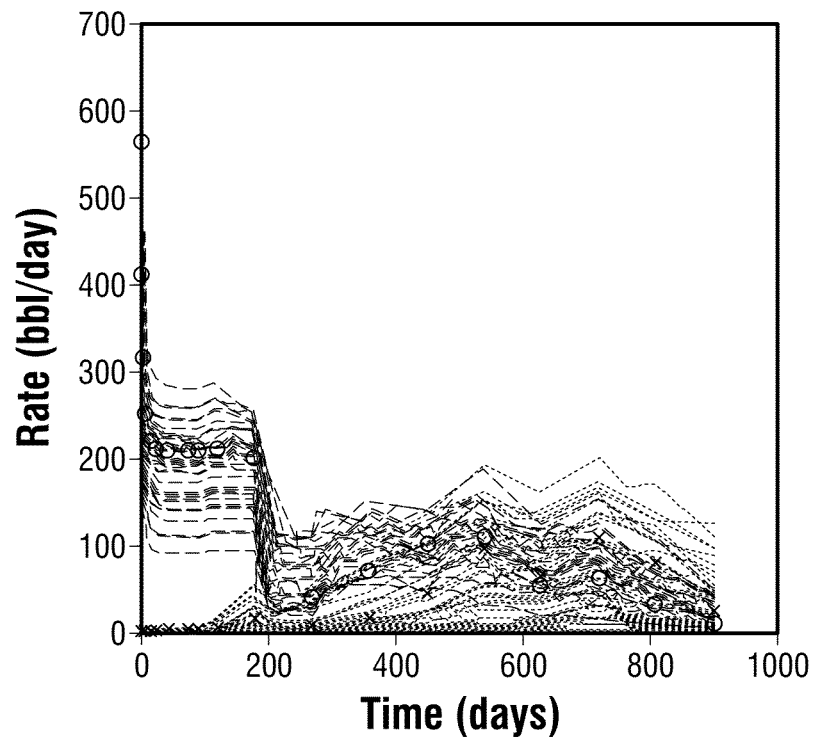
Figure 19D:
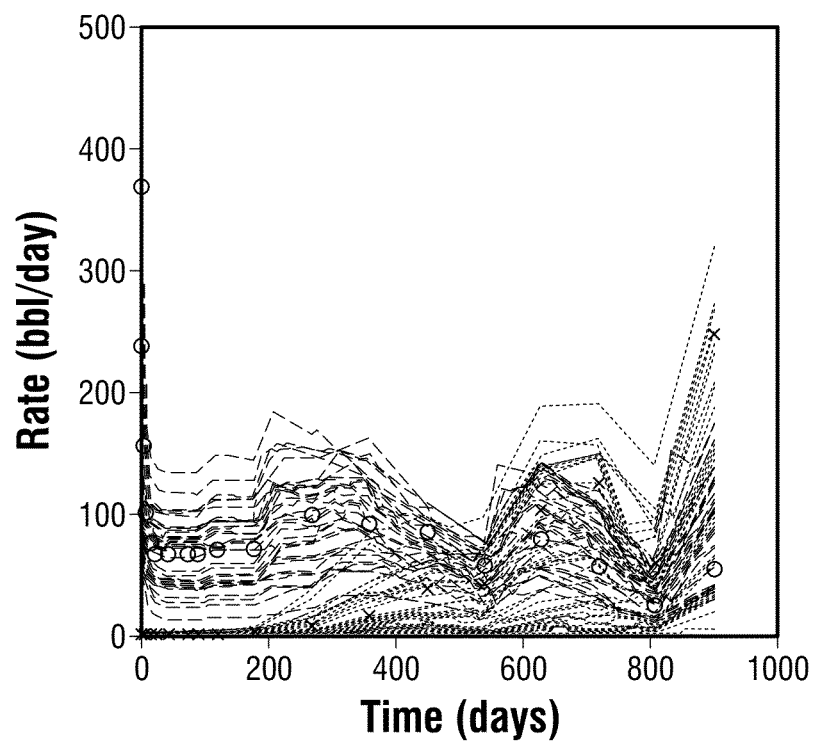
Figure 20A:
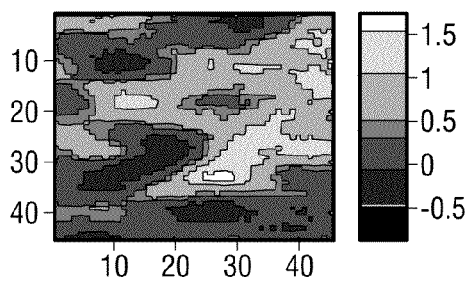
FIGS. 20A-20J show final ensemble members (permeability) for the iterative EnS with PCA parameterization.
Figure 20B:
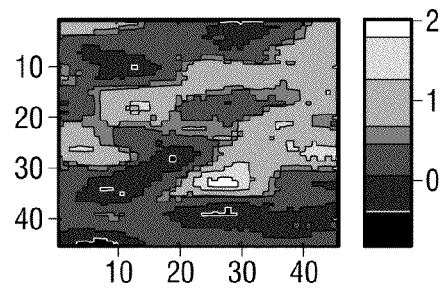
Figure 20C:
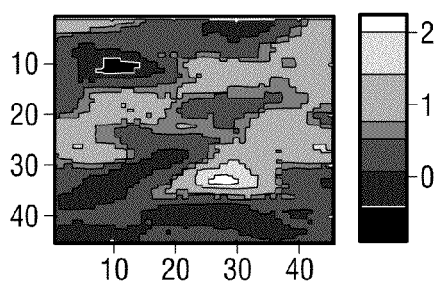
Figure 20D:
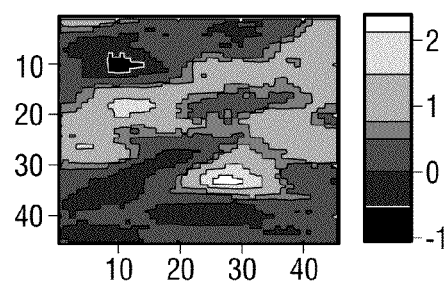
Figure 20E:
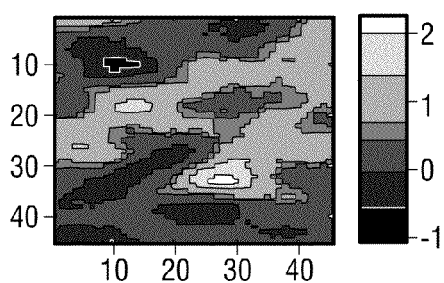
Figure 20F:
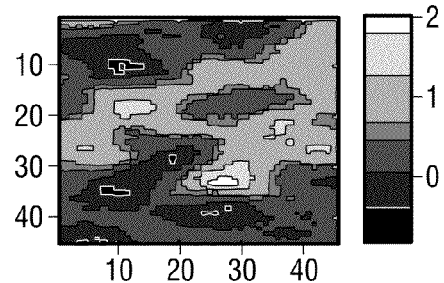
Figure 20G:
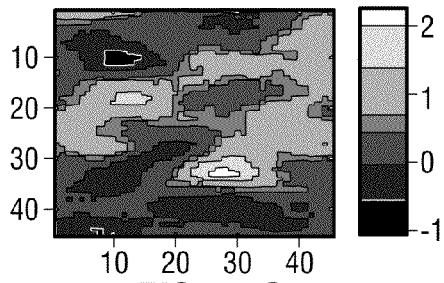
Figure 20H:
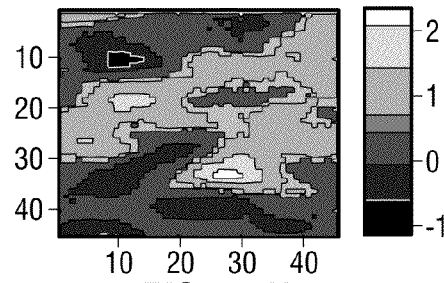
Figure 20I:
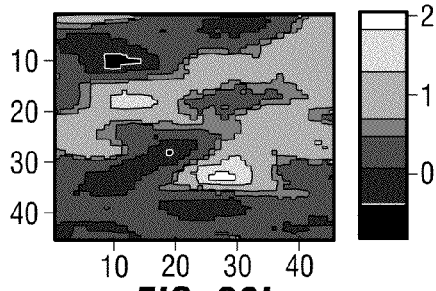
Figure 20J:
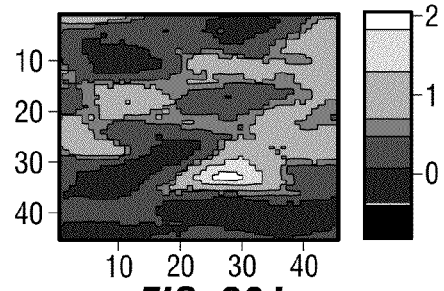
Figure 21:
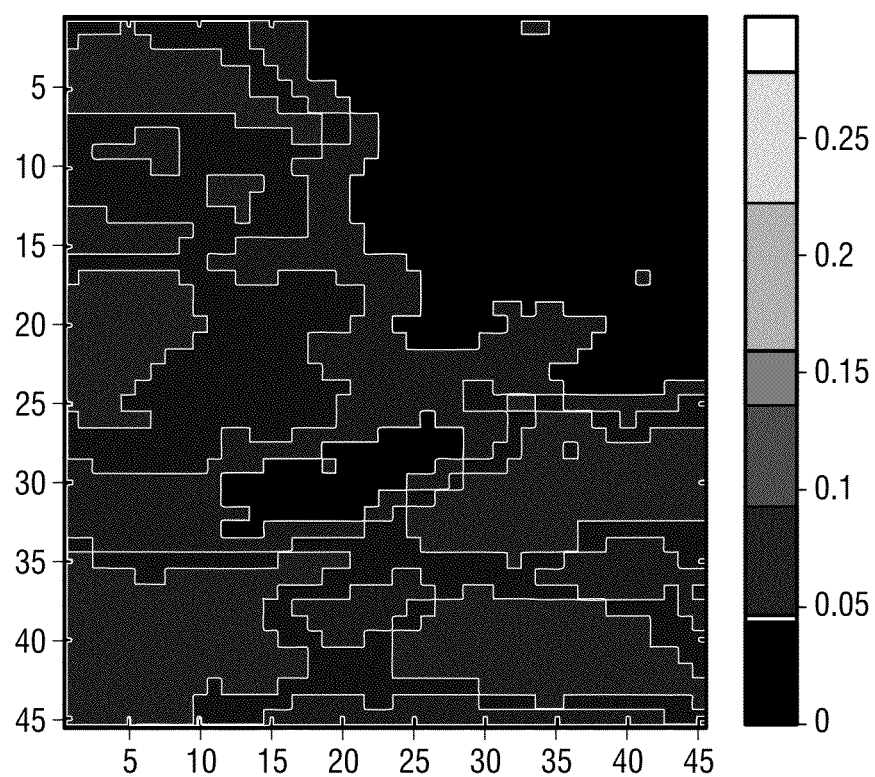
FIG. 21 shows variance of permeability of the final ensemble of the iterative EnS with PCA parameterization.
Figure 22A:
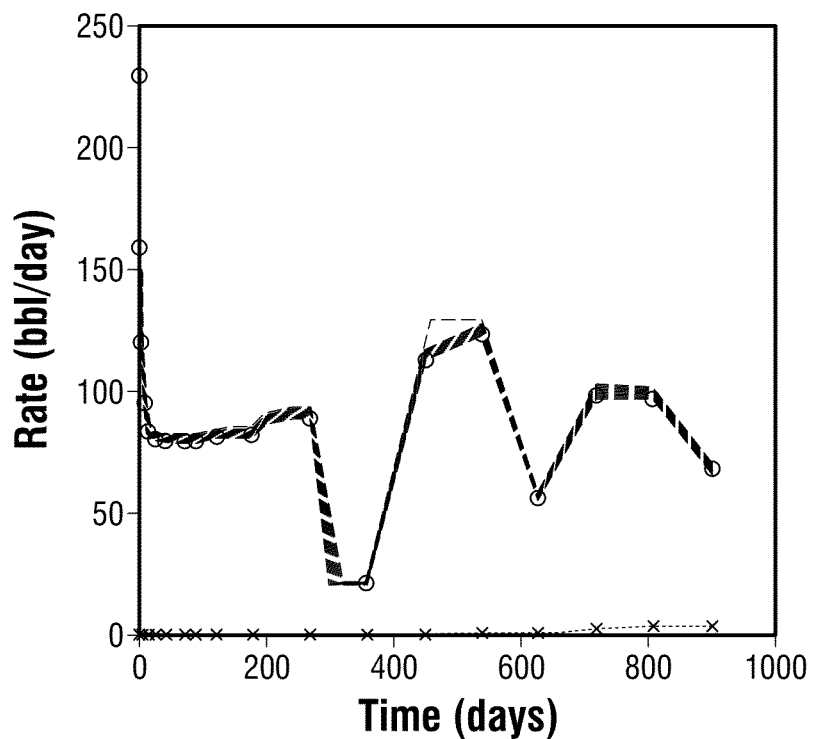
FIGS. 22A-22D show oil and water production rates of the final ensemble for the 4 producers, and the observed rates (circles for oil and X's for water) for the iterative EnS with PCA parameterization.
Figure 22B:
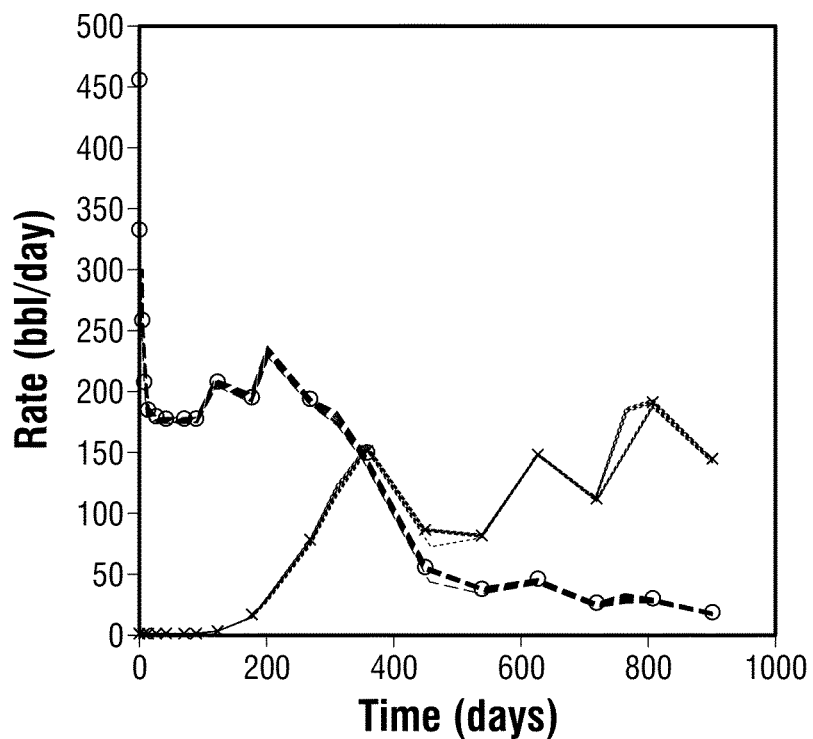
Figure 22C:
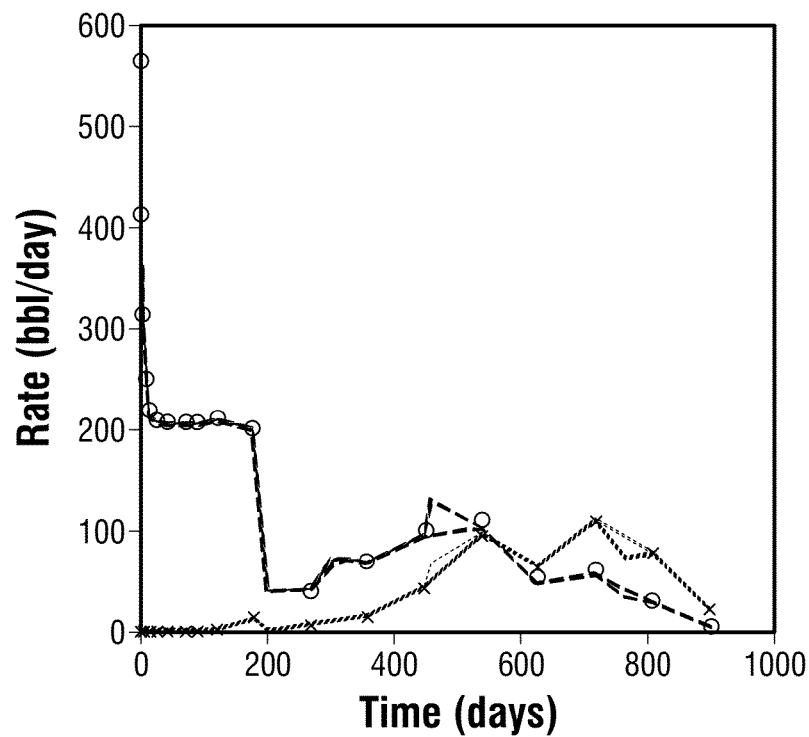
Figure 22D:
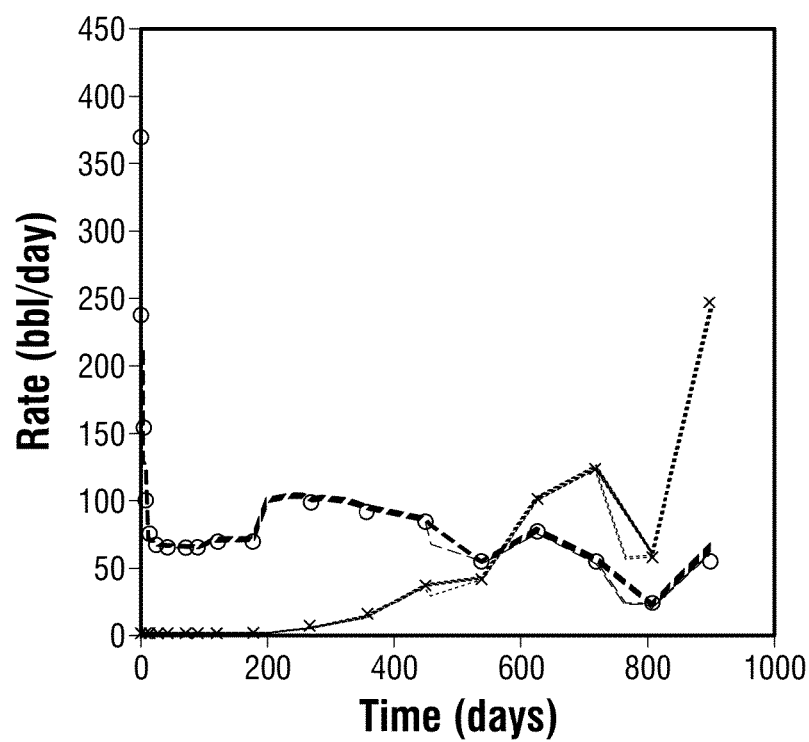
Figure 23A:
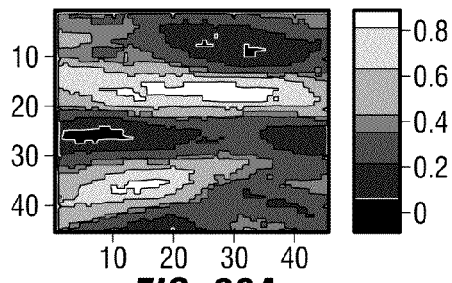
FIG. 23A-23J show initial ensemble members (permeability) for the iterative EnS with KPCA (order 5) parameterization.
Figure 23B:
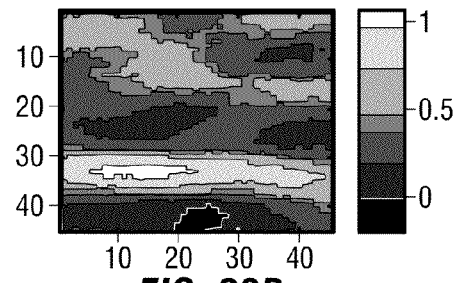
Figure 23C:
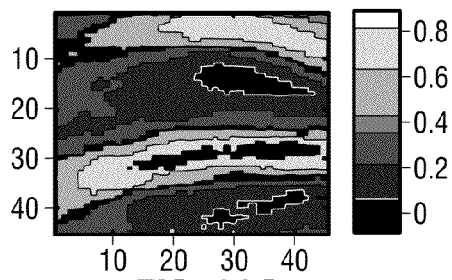
Figure 23D:
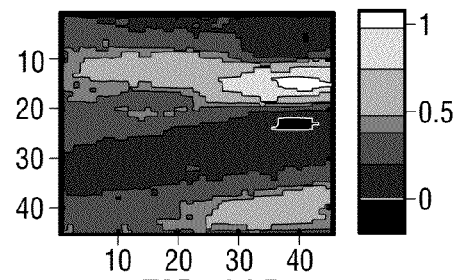
Figure 23E:
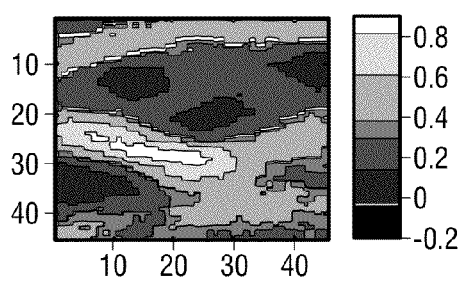
Figure 23F:
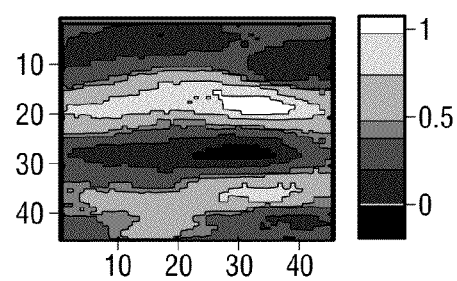
Figure 23G:
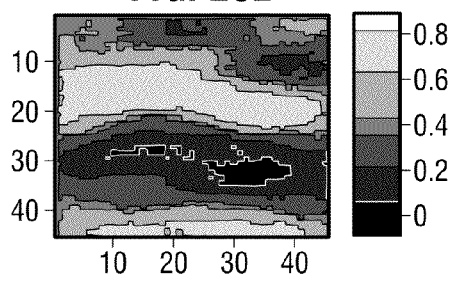
Figure 23H:
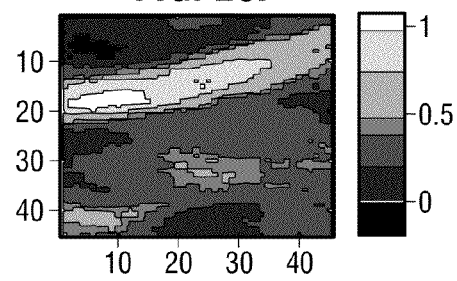
Figure 23I:
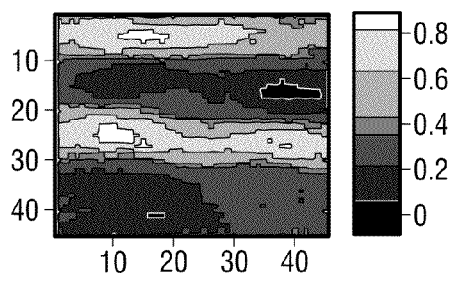
Figure 23J:
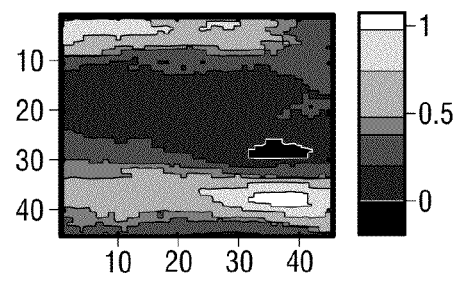
Figure 24:
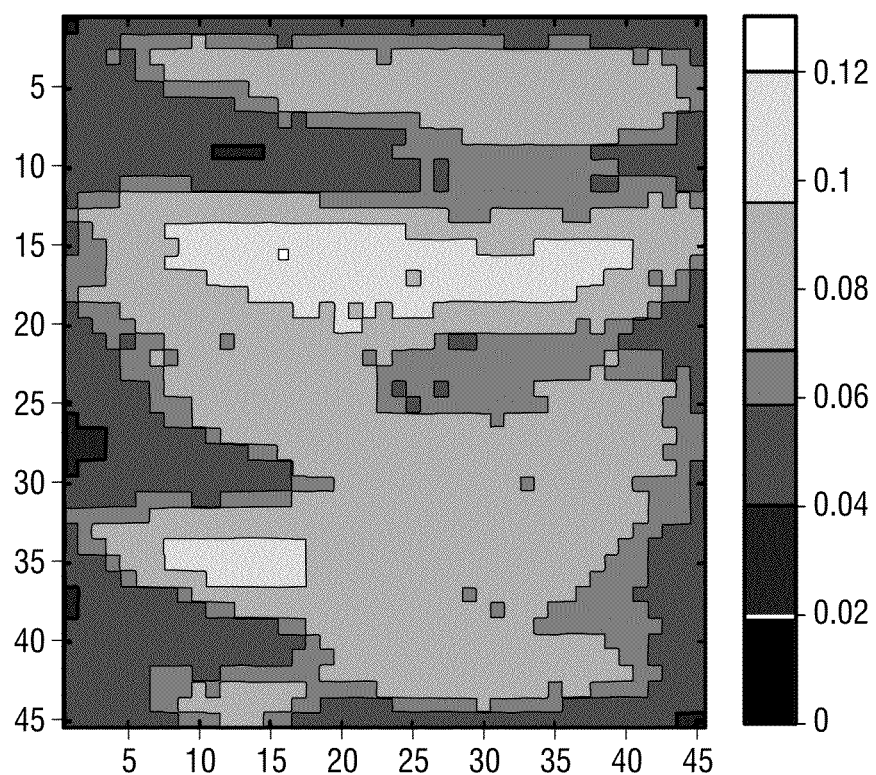
FIG. 24 shows variance of permeability of the initial ensemble of the iterative EnS with KPCA (order 5) parameterization.
Figure 25A:
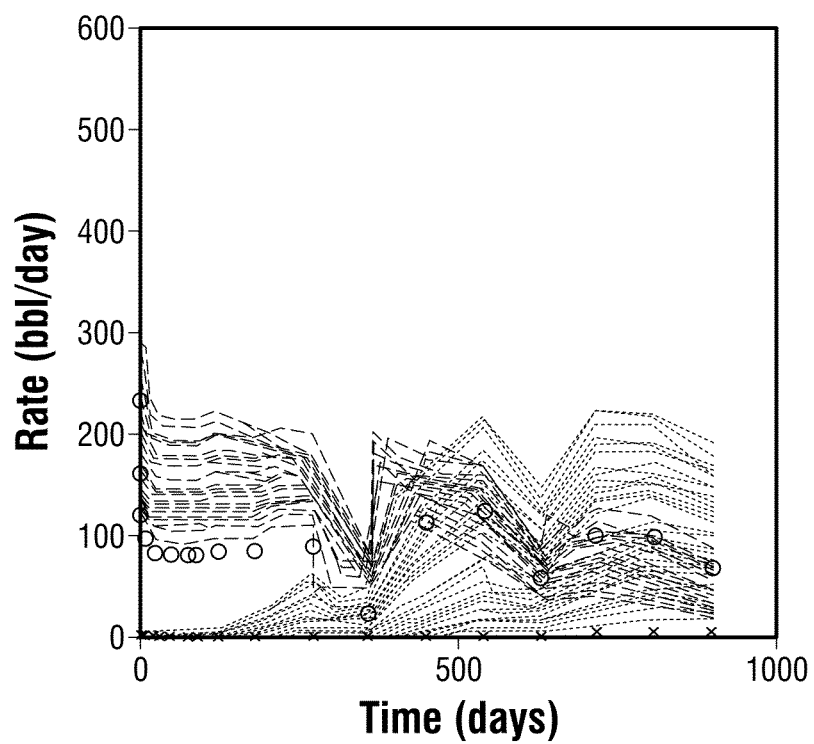
FIG. 25A-25D show and water production rates of the initial ensemble for the 4 producers, and the observed rates (circles for oil and X's for water) for the iterative EnS with KPCA (order 5) parameterization.
Figure 25B:
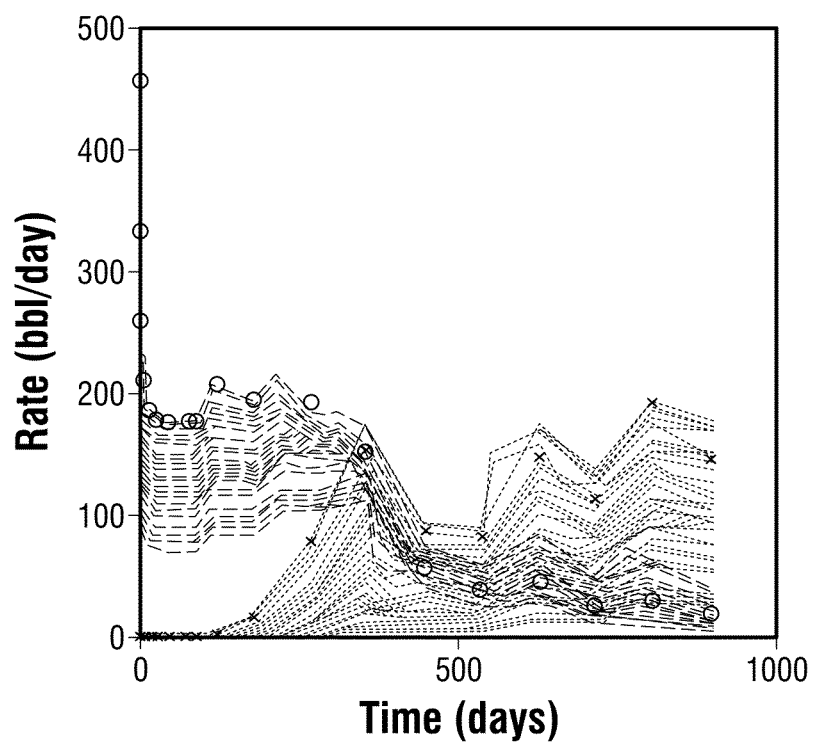
Figure 25C:
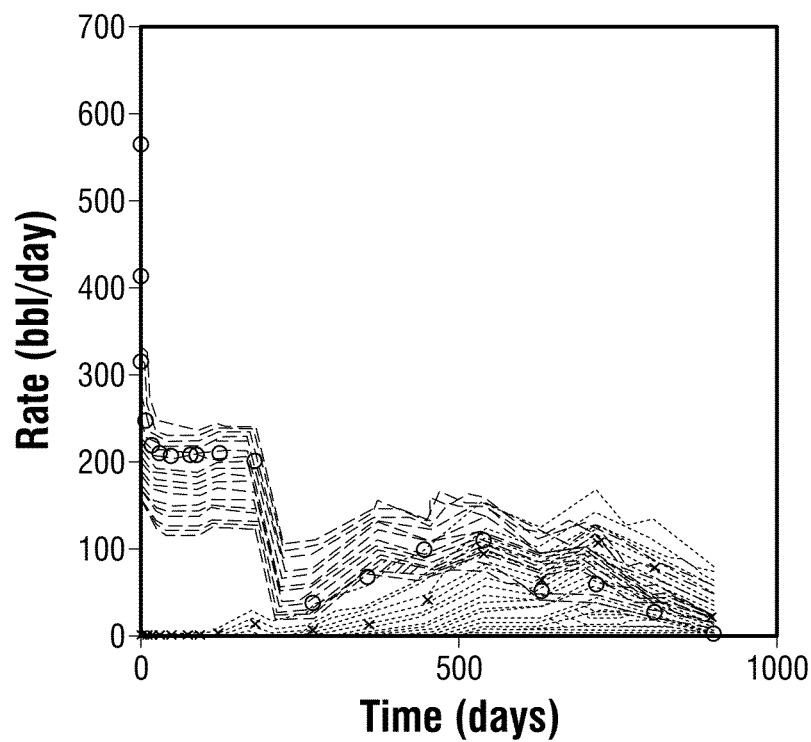
Figure 25D:
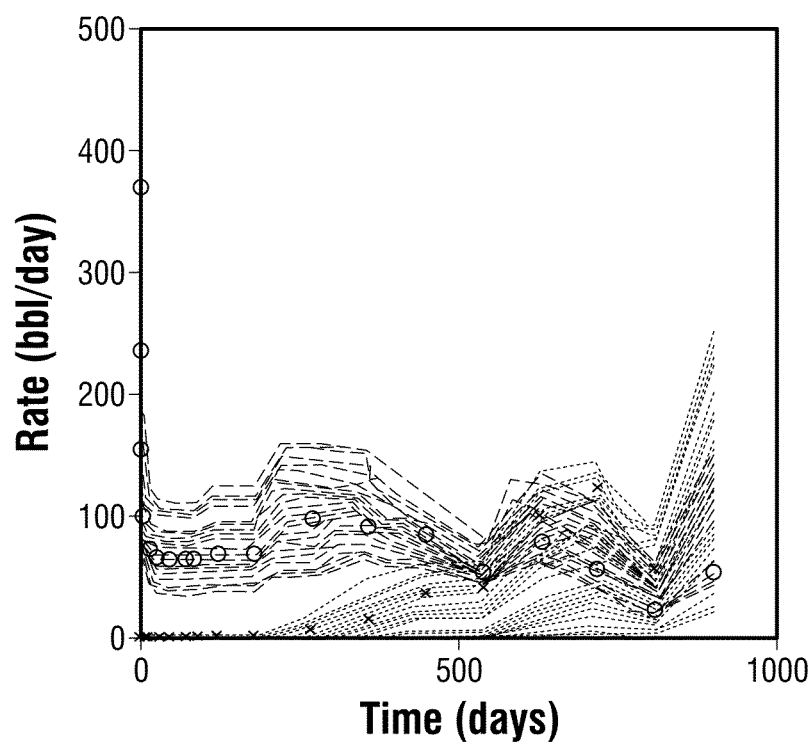
Figure 26A:
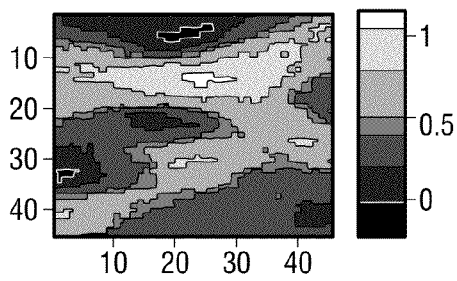
FIG. 26A-26J show final ensemble members (permeability) for the iterative EnS with KPCA (order 5) parameterization.
Figure 26B:
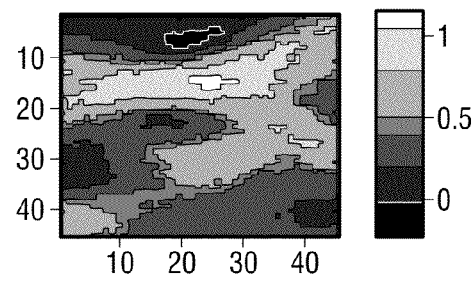
Figure 26C:
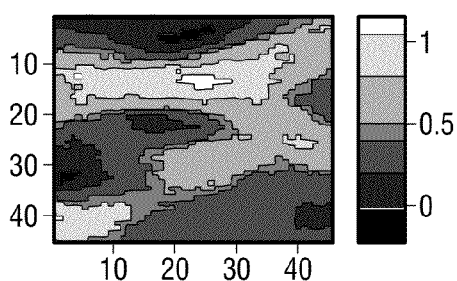
Figure 26D:
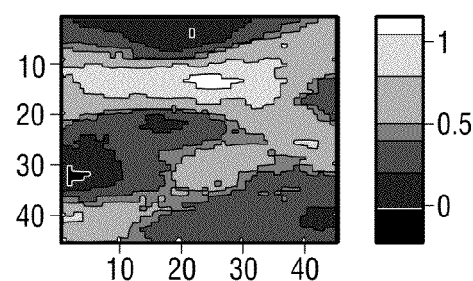
Figure 26E:
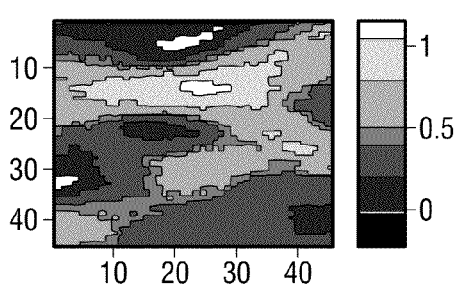
Figure 26F:
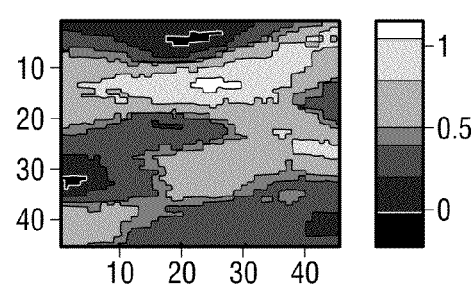
Figure 26G:
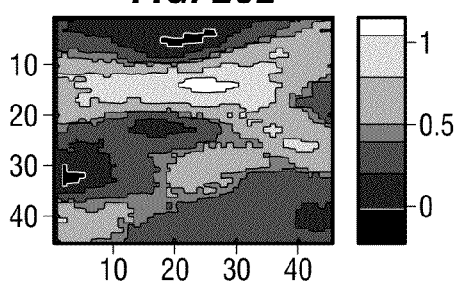
Figure 26H:
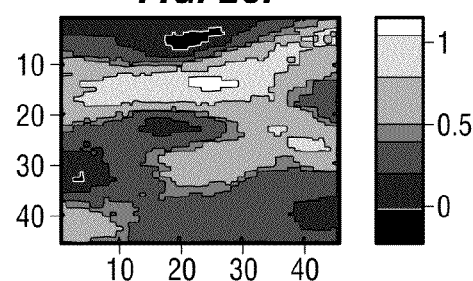
Figure 26I:
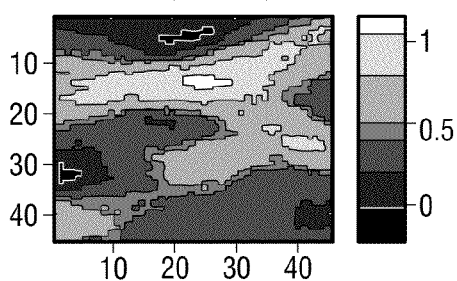
Figure 26J:
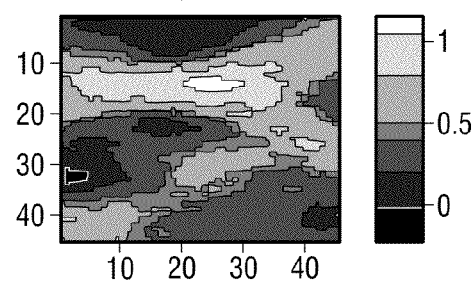
Figure 27:
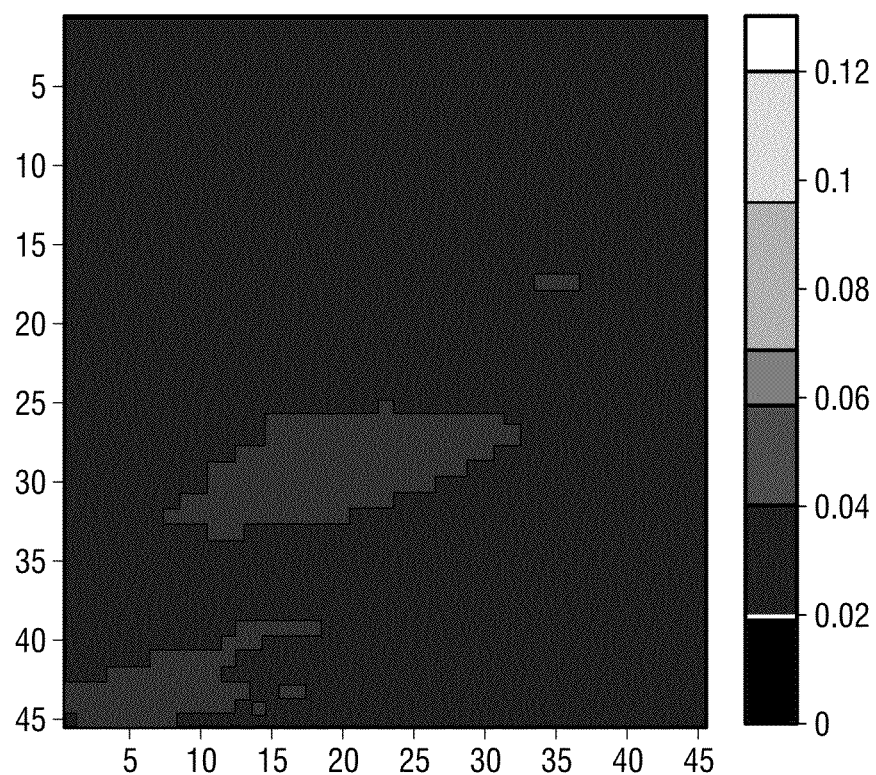
FIG. 27 shows variance of permeability of the final ensemble of the iterative EnS with KPCA (order 5) parameterization.
Figure 28A:
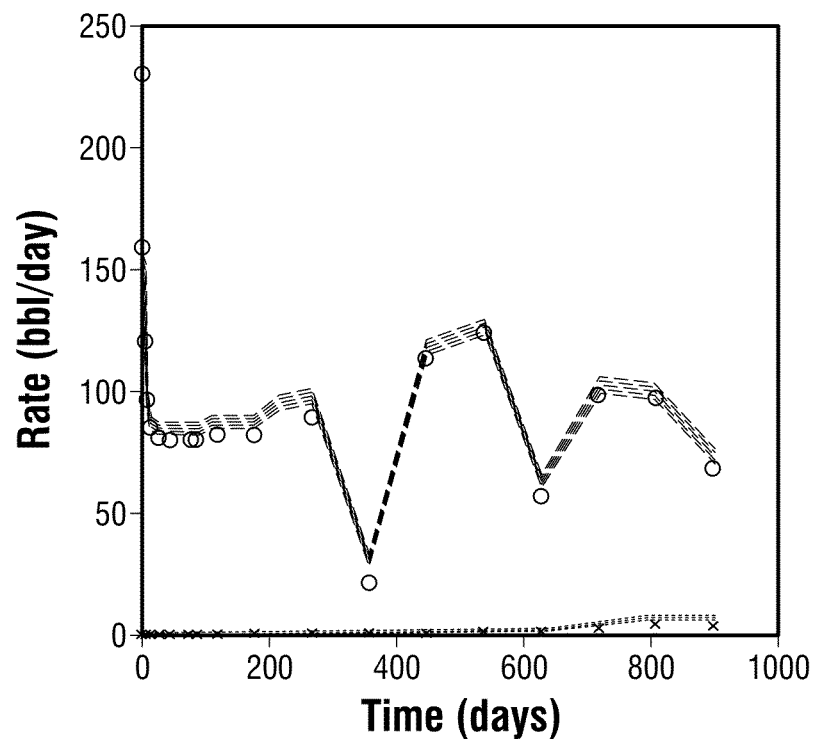
FIG. 28A-28D show oil and water production rates of the final ensemble for the 4 producers, and the observed rates (circles for oil and X's for water) for the iterative EnS with KPCA (order 5) parameterization.
Figure 28B:
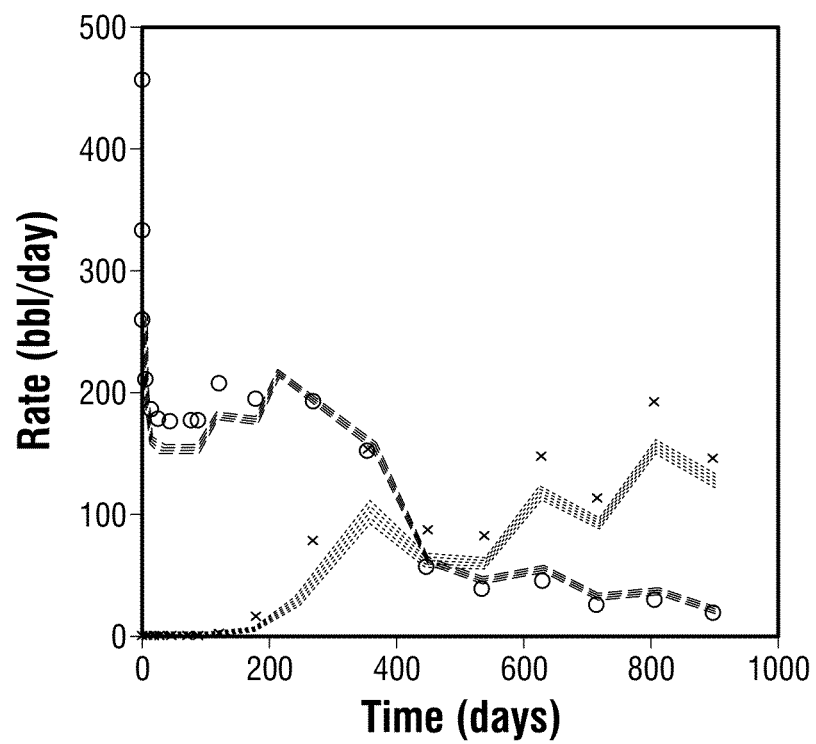
Figure 28C:
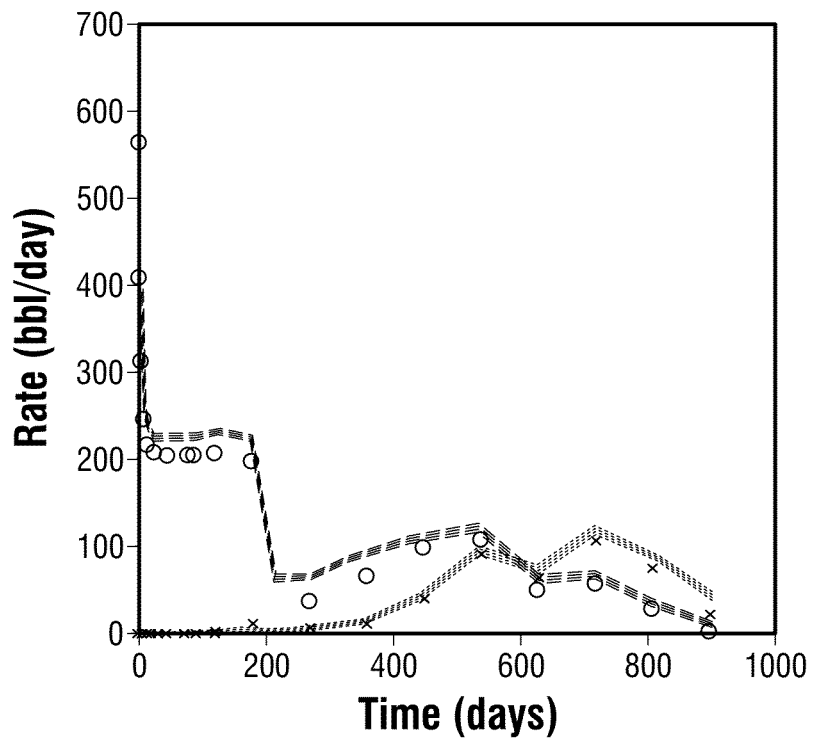
Figure 28D:
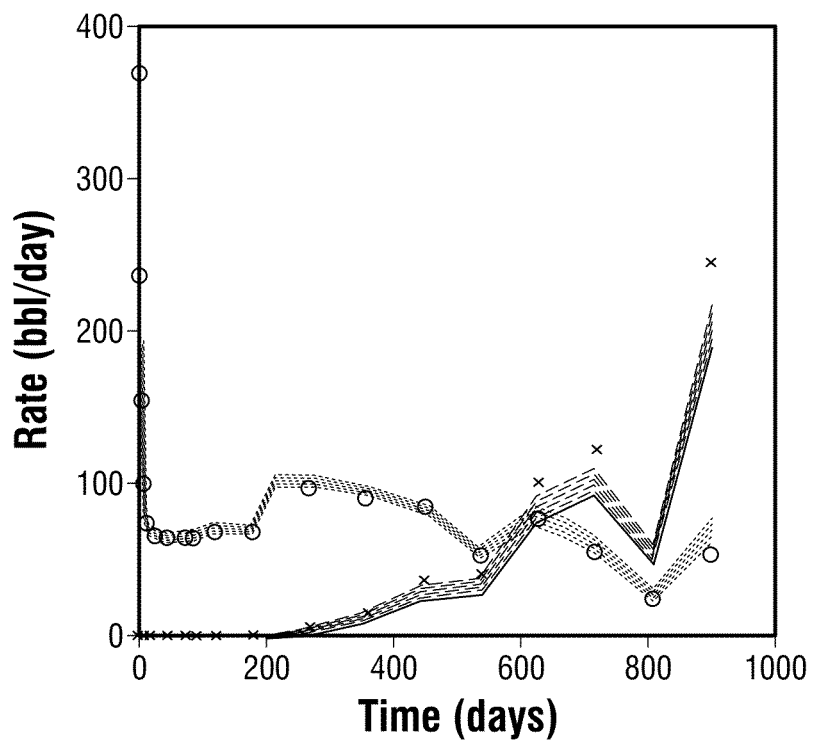
Figure 29A:
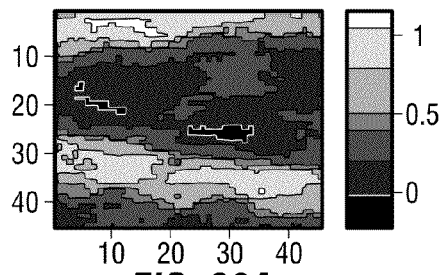
FIG. 29A-29J show initial ensemble members (permeability) for the subspace iterative EnS with KPCA (order 5) parameterization.
Figure 29B:
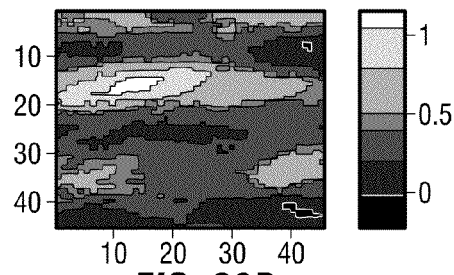
Figure 29C:
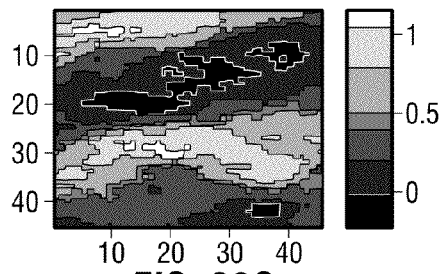
Figure 29D:
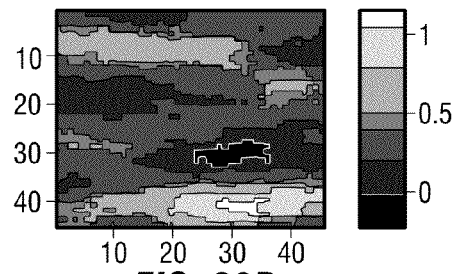
Figure 29E:
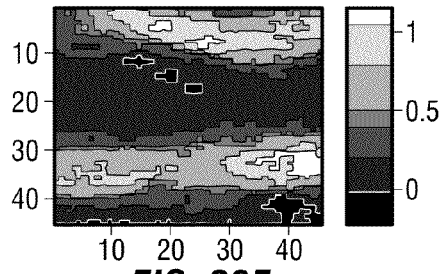
Figure 29F:
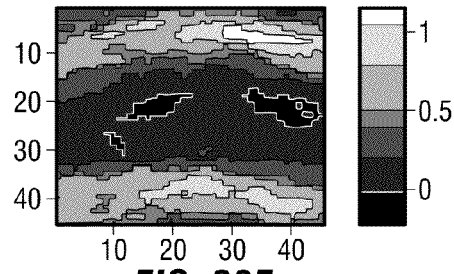
Figure 29G:
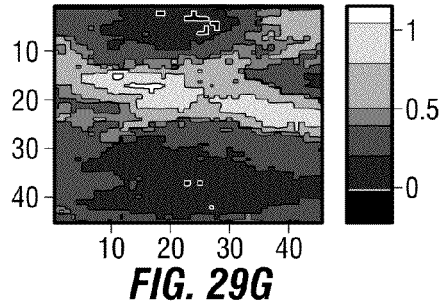
Figure 29H:
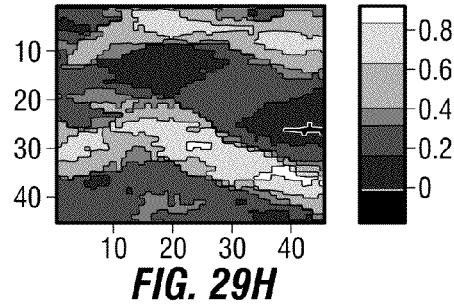
Figure 29I:
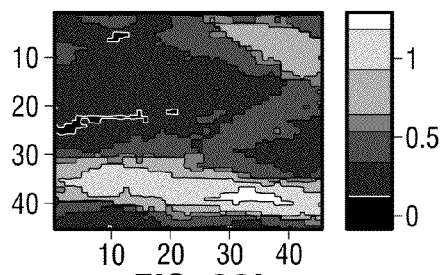
Figure 29J:
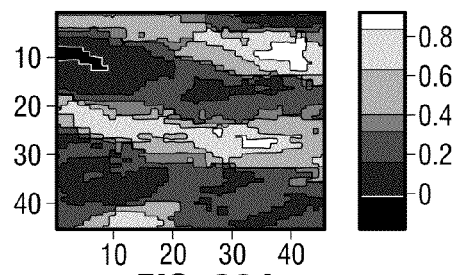

FIGS. 17-22 demonstrate the application of the iterative EnS with PCA parameterization. 1000 realizations from the 2400 created earlier were used to create the PCA parameterization with 60 parameters. FIGS. 17A-17J show 10 members of the initial ensemble obtained with this standard PCA parameterization. Although longer correlations are obtained in the horizontal direction corresponding to the channels, the realizations are multi-Gaussian as expected and are not able to reproduce the channel structure of the training image. The variance of permeability across the initial ensemble is reasonable as seen in FIG. 18, which is also observed through the large spread of the production data in FIGS. 19A-19D. FIGS. 20A-20J show 10 realizations of the final ensemble after 5 iterations of the EnS. The ensemble has clearly collapsed as confirmed by FIG. 21, and additionally, the channel structure is completely absent from these realizations. However, the data match is almost perfect, as seen in FIGS. 22A-22D, implying that the production data is not enough to uniquely identify the permeability field.

FIGS. 23-28 demonstrate the application of the iterative EnS with KPCA parameterization with a $5^{th}$ order polynomial kernel. As above, 1000 realizations from the 2400 created earlier were used to create the KPCA parameterization with 60 parameters. Compared to the standard PCA parameterization above, while the final ensemble is clearly able to reproduce channel looking structures as seen in FIGS. 26A-26J, the ensemble has again collapsed as confirmed by FIG. 27. Furthermore, the final converged realization(s) is clearly quite different from the true realization. Comparing the true realization to the converged realization, while the upper channel's location is correctly determined due to its proximity to the wells, the lower channel is completely missing. Note that the data match is not as of high quality as standard PCA, but it is quite good. The main reason for the lower quality data match is the higher nonlinearity of the KPCA parameterization.

Figure 30:
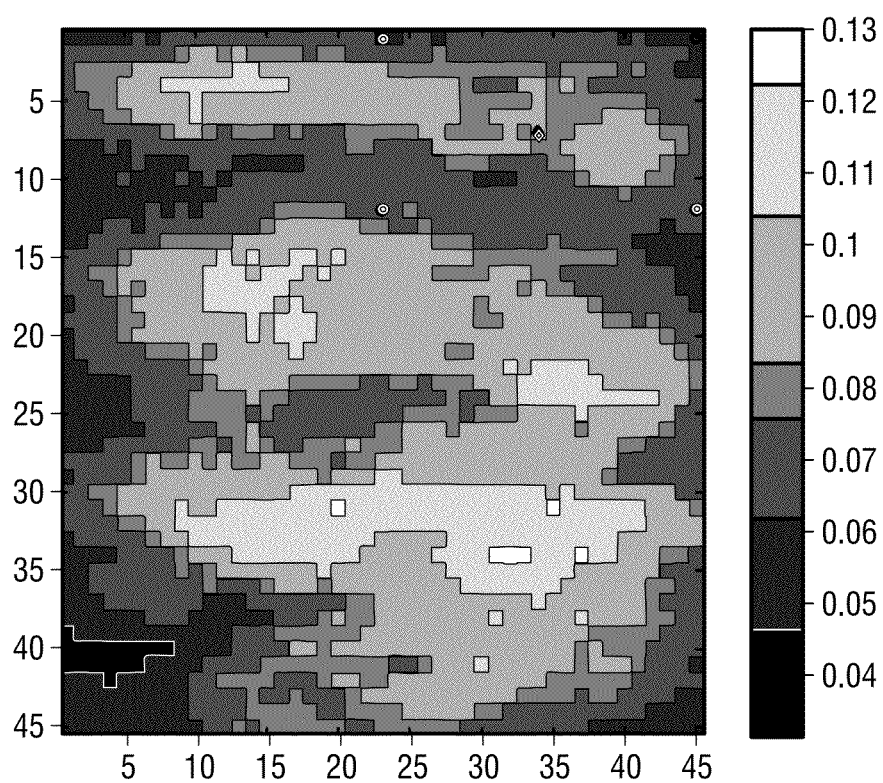
FIG. 30 shows variance of permeability of the initial ensemble of the subspace iterative EnS with KPCA (order 5) parameterization.
Figure 32A:
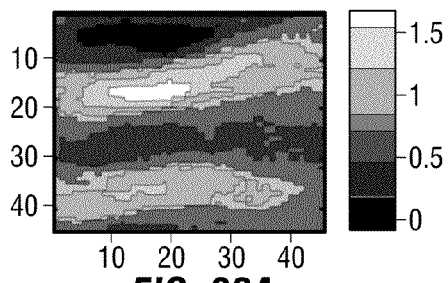
FIG. 32A-32J show final ensemble members (permeability) for the subspace iterative EnS with KPCA (order 5) parameterization.
Figure 32B:
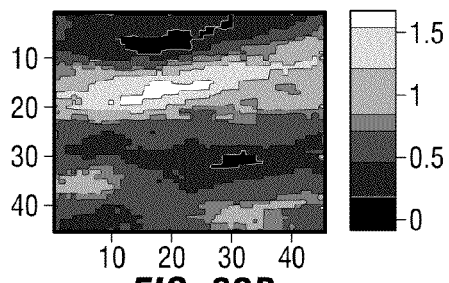
Figure 32C:
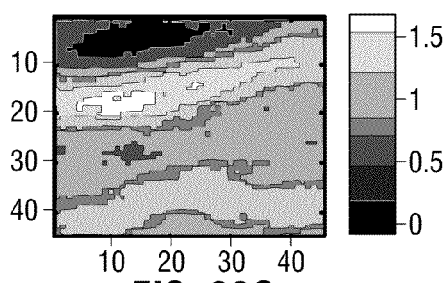
Figure 32D:
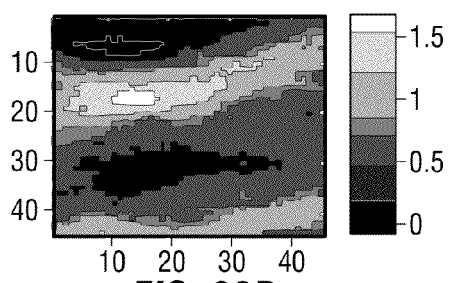
Figure 32E:
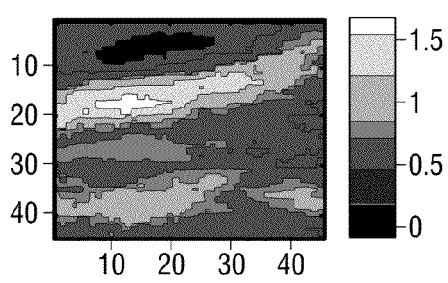
Figure 32F:
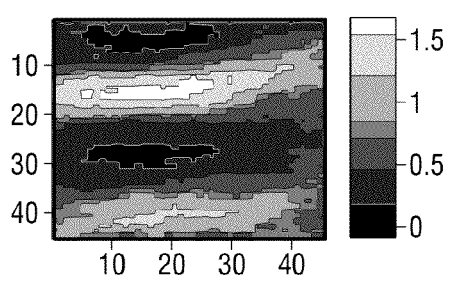
Figure 32G:
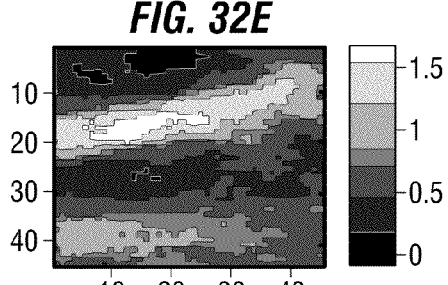
Figure 32H:
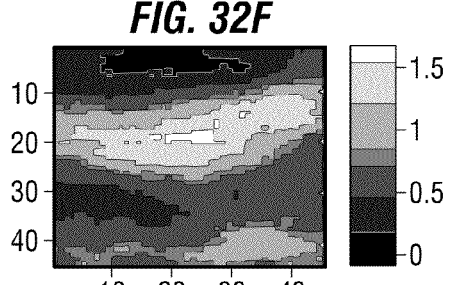
Figure 32I:
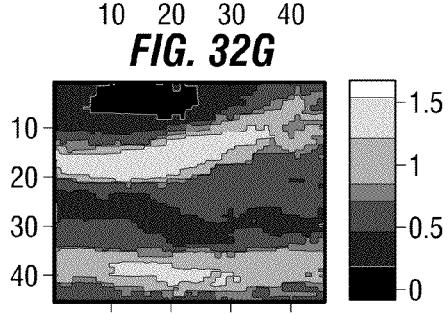
Figure 32J:
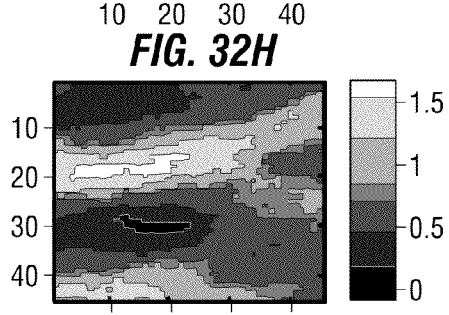
Figure 33:
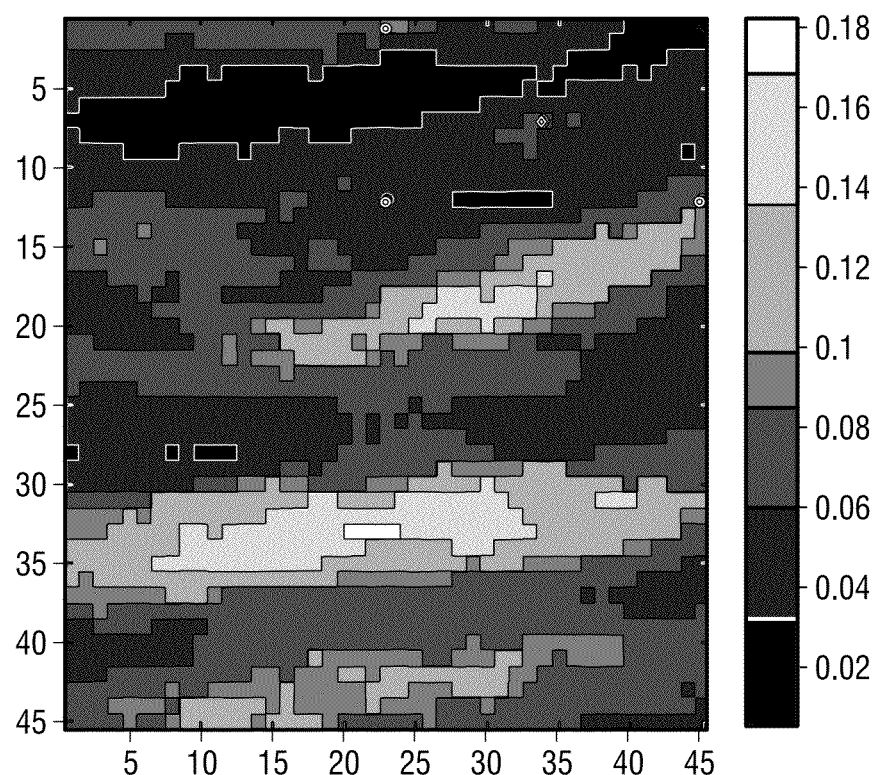
FIG. 33 shows variance of permeability of the final ensemble of the subspace iterative EnS with KPCA (order 5) parameterization.

FIGS. 29-34 demonstrate the application of the subspace iterative EnS with KPCA parameterization with a $5^{th}$ order polynomial kernel. For each of the 40 ensemble members, a different set of 60 realizations from the 2400 available realizations are used to create 40 KPCA parameterizations, each with 60 parameters as above. FIGS. 29A-29J show 10 members of the initial ensemble and FIG. 30 shows the variance across the ensemble. Again the variance is reasonable as also confirmed by the spread of the production data in FIGS. 31A-31D. FIGS. 32A-32J show 10 members of the final ensemble. While the channel structures are as well defined as the example above without the subspace formulation, with the subspace formulation, the ensemble has clearly not collapsed. Again, while the upper channel exists in all the final realizations due to its proximity to the wells, the lower channel is now present in some realizations and not in others. In other words, while uncertainty in the location of the upper channel is reduced by assimilating production data, because the lower channel is far away from the wells, production data from these wells do not contain enough information about the lower channel to reduce its uncertainty. The variance across the final realizations as seen in FIG. 33 also confirms this. Although the data match is not as good at the iterative EnS without the subspace formulation, it is acceptable and is much better than the initial ensemble.

To summarize, the basic idea of the subspace EnKF/EnS is to constrain the different ensemble members to different subspaces of the same or different random fields. This is accomplished by parameterizing the random fields and modifying the EnKF/EnS formulation with the gradients of the parameterizations. The subspace EnKF/EnS prevents ensemble collapse, providing a better quantification of uncertainty, and more importantly, retains key geological characteristics of the initial ensemble, even when each ensemble member belongs to a different geological model. The subspace EnKF/EnS can further be improved to honor multi-point geostatistics by extending the subspace formulation with kernel PCA. Formulating the subspace EnKF/EnS with kernel PCA parameterization alleviates both the key problems of the traditional EnKF/EnS, namely ensemble collapse and inability to honor multi-point geostatistics.

The above described methods can be implemented in the general context of instructions executed by a computer. Such computer-executable instructions may include programs, routines, objects, components, data structures, and computer software technologies that can be used to perform particular tasks and process abstract data types. Software implementations of the above described methods may be coded in different languages for application in a variety of computing platforms and environments. It will be appreciated that the scope and underlying principles of the above described methods are not limited to any particular computer software technology.

Moreover, those skilled in the art will appreciate that the above described methods may be practiced using any one or a combination of computer processing system configurations, including, but not limited to, single and multi-processer systems, hand-held devices, programmable consumer electronics, mini-computers, or mainframe computers. The above described methods may also be practiced in distributed computing environments where tasks are performed by servers or other processing devices that are linked through a one or more data communications networks. In a distributed computing environment, program modules may be located in both local and remote computer storage media including memory storage devices.

Also, an article of manufacture for use with a computer processor, such as a CD, pre-recorded disk or other equivalent devices, could include a computer program storage medium and program means recorded thereon for directing the computer processor to facilitate the implementation and practice of the above described methods. Such devices and articles of manufacture also fall within the spirit and scope of the present invention.

As will be described, the invention can be implemented in numerous ways, including for example as a method (including a computer-implemented method), a system (including a computer processing system), an apparatus, a computer readable medium, a computer program product, a graphical user interface, a web portal, or a data structure tangibly fixed in a computer readable memory. Several embodiments of the present invention are discussed below. The appended drawings illustrate only typical embodiments of the present invention and therefore are not to be considered limiting of its scope and breadth.

Figure 35:
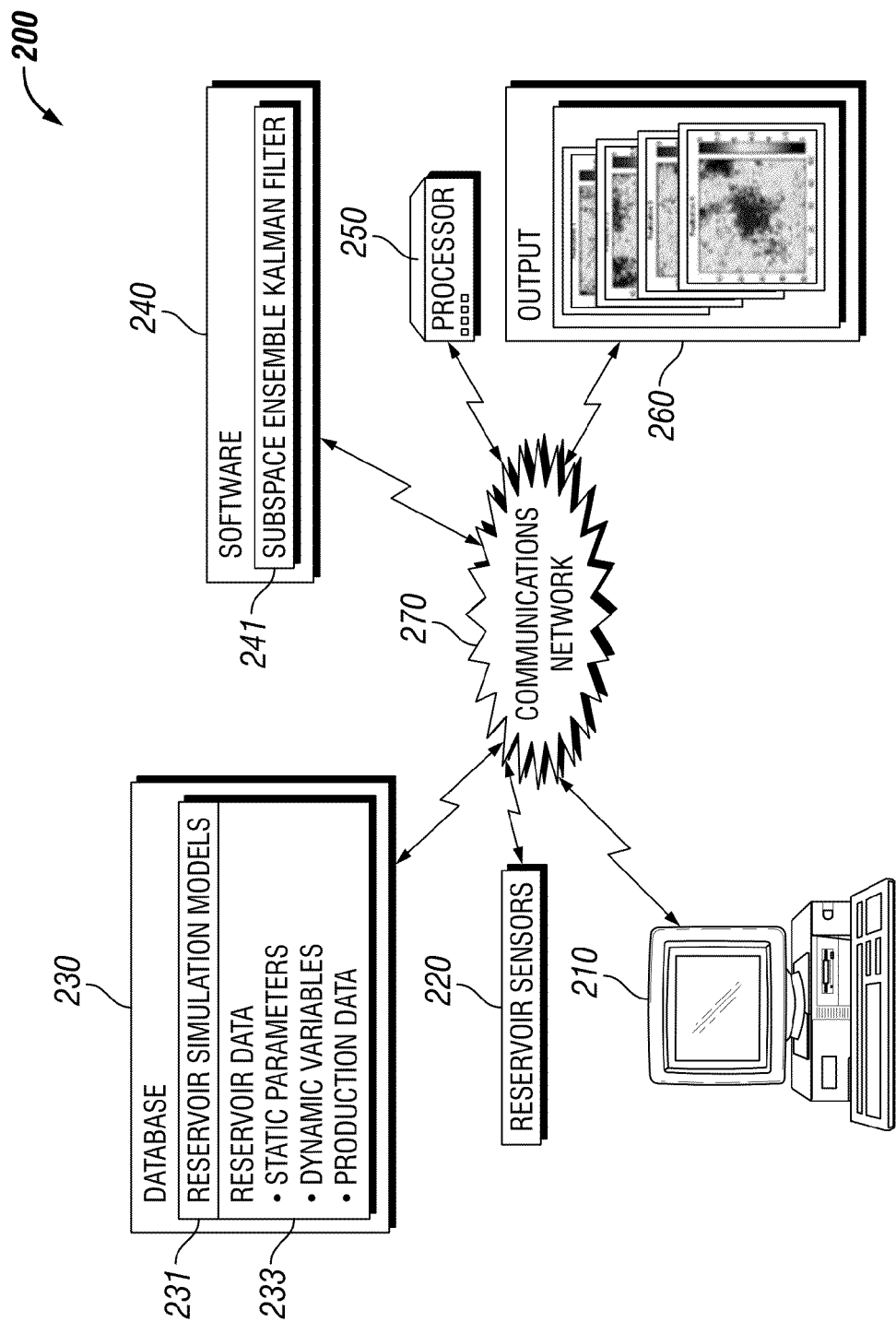
FIG. 35 shows a system for updating simulation models of a subterranean reservoir using subspace ensemble Kalman filters.

FIG. 35 illustrates a system 200 for updating simulation models of a subterranean reservoir, such as by using computer-implemented method. System 200 includes user interface 210, such that an operator can actively input information and review operations of system 200. User interface 210 can be any means in which a person is capable of interacting with system 200 such as a keyboard, mouse, or touch-screen display. Operator-entered data input into system 200 through user interface 210, can be stored in database 230. Reservoir field data, including for example, well pressure, oil production, water production, gas production, or seismic data, which is received by one or more reservoir sensors 220, can also be input into system 200 for storage in database 230. Additionally, any information generated by system 200 can be stored in database 230.

Database 230 can store user-defined variables, equations and parameters such as equality constraints and inequality constraints, as well as, reservoir production data, and system generated computed solutions. For example, reservoir simulation models 231 and reservoir data 233, such as static variables (permeability fields, porosity fields), dynamic variables (pressure, saturation), and production data (production and injection rates, bottom-hole pressures), are all examples of information that can be stored in database 230. In some embodiments, reservoir simulation models 231 and reservoir data 233 are stored in database 230 as a series of state vectors or an ensemble of realizations for a given assimilation time. An initial ensemble of models can be provided that includes initial reservoir characteristics, at a time $t_0$, derived by operators and/or computer modeling based on initial observations, knowledge or data gathered about the reservoir. The initial ensemble of models may take into account initial estimates of permeability, porosity and other characteristics used to create simulation models of subterranean reservoirs.

System 200 includes a computer program product or software 240 that is stored on a non-transitory processor readable medium. Current examples of a processor readable medium include, but are not limited to, an electronic circuit, a semiconductor memory device, a ROM, a flash memory, an erasable programmable ROM (EPROM), a floppy diskette, a compact disk (CD-ROM), an optical disk, a hard disk, and a fiber optic medium. As will be described more fully herein, software 240 can include a plurality of modules for performing system tasks such as performing the methods previously described herein. Processor 250 interprets instructions to execute software 240, as well as, generates automatic instructions to execute software for system 200 responsive to predetermined conditions. Instructions from both user interface 210 and software 240 are processed by processor 250 for operation of system 200. In some embodiments, a plurality of processors can be utilized such that system operations can be executed more rapidly.

In certain embodiments, system 200 can include reporting unit 260 to provide information to the operator or to other systems (not shown). For example, reporting unit 260 can be a printer, display screen, or a data storage device. However, it should be understood that system 200 need not include reporting unit 260, and alternatively user interface 210 can be utilized for reporting information of system 200 to the operator.

Communication between any components of system 200, such as user interface 210, reservoir sensors 220, database 230, software 240, processor 250 and reporting unit 260, can be transferred over a communications network 270. Communications network 270 can be any means that allows for information transfer. Examples of communications network 270 presently include, but are not limited to, a switch within a computer, a personal area network (PAN), a local area network (LAN), a wide area network (WAN), and a global area network (GAN). Communications network 270 can also include any hardware technology used to connect the individual devices in the network, such as an optical cable or wireless radio frequency.

In operation, an operator initiates software 240, through user interface 210, to perform the methods described herein.

Outputs from software 240 can be stored in database 230. For example, software 240 can update an ensemble of reservoir models. A visual display can be produced, such as through reporting unit 260 or user interface 210, using the updated ensemble of reservoir models. For example, the updated ensemble of reservoir models can be transformed into image data representations of the subterranean reservoir for display to a user or operator. The displayed information can be utilized to forecast or optimize the production performance of the subterranean reservoir, which can then be used for reservoir management decisions.

As used in this specification and the following claims, the terms "comprise" (as well as forms, derivatives, or variations thereof, such as "comprising" and "comprises") and "include" (as well as forms, derivatives, or variations thereof, such as "including" and "includes") are inclusive (i.e., open-ended) and do not exclude additional elements or steps. Accordingly, these terms are intended to not only cover the recited element(s) or step(s), but may also include other elements or steps not expressly recited. Furthermore, as used herein, the use of the terms "a" or "an" when used in conjunction with an element may mean "one," but it is also consistent with the meaning of "one or more," "at least one," and "one or more than one." Therefore, an element preceded by "a" or "an" does not, without more constraints, preclude the existence of additional identical elements.

The use of the term "about" applies to all numeric values, whether or not explicitly indicated. This term generally refers to a range of numbers that one of ordinary skill in the art would consider as a reasonable amount of deviation to the recited numeric values (i.e., having the equivalent function or result). For example, this term can be construed as including a deviation of ±10 percent of the given numeric value provided such a deviation does not alter the end function or result of the value. Therefore, a value of about 1% can be construed to be a range from 0.9% to 1.1%.

While in the foregoing specification this invention has been described in relation to certain preferred embodiments thereof, and many details have been set forth for the purpose of illustration, it will be apparent to those skilled in the art that the invention is susceptible to alteration and that certain other details described herein can vary considerably without departing from the basic principles of the invention. For example, while embodiments of the present disclosure are described with reference to block diagrams and/or operational illustrations of methods, systems, and computer program products, the functions/acts described in the figures may occur out of the order (i.e., two blocks shown in succession may in fact be executed substantially concurrently or the blocks may sometimes be executed in the reverse order).

What is claimed is:

1. A computer-implemented method for updating simulation models of a subterranean reservoir, the method comprising:
   providing an ensemble of reservoir models representing a subterranean reservoir;
   providing reservoir data from the subterranean reservoir; and
   updating, using a computer processor, the ensemble of reservoir models using the reservoir data and a subspace ensemble Kalman filter that constrains each ensemble member of the ensemble of reservoir models to a different subspace of a full space, wherein an equation is used to update the ensemble of reservoir models, wherein the equation is:

$$m_j^u = g^j\left(\xi_j^f + \frac{dg^j(\xi)}{d\xi_j^f}K_g(d_{o,j} - d_j)\bigg|_{1:N_m}\right)$$

$$\forall\, j = 1, \ldots, M$$

wherein M refers to number of ensemble members of the ensemble of reservoir models;
wherein m refers to a random field;
wherein g is a parameterization function relating a small number of random variables $\xi$ to the random field m;
wherein $K_g$ refers to a Kalman Gain;
wherein $d_o$ refers to the reservoir data with perturbation; and
wherein d refers to simulated reservoir data.

2. The computer-implemented method of claim 1, wherein updating the ensemble of reservoir models using the subspace ensemble Kalman filter further comprises applying a different parameterization to each ensemble member of the ensemble of reservoir models.

3. The computer-implemented method of claim 2, wherein each parameterization ensures that ensemble members remain in a subspace to which it is constrained.

4. The computer-implemented method of claim 2, wherein the parameterization comprises kernel principle component analysis.

5. The computer-implemented method of claim 1, wherein updating the ensemble of reservoir models using the subspace ensemble Kalman filter further comprises applying kernel principle component analysis parameterization.

6. The computer-implemented method of claim 1, wherein updating the ensemble of reservoir models using the subspace ensemble Kalman filter further comprises applying K-L expansion parameterization.

7. The computer-implemented method of claim 1, wherein the subterranean reservoir has non-Gaussian characteristics, and wherein the updated ensemble of reservoir models is consistent with the reservoir data from the subterranean reservoir and preserves the non-Gaussian characteristics of the subterranean reservoir.

8. A system for updating simulation models of a subterranean reservoir, the system comprising:
   a database configured to store data comprising reservoir data from a subterranean reservoir and an ensemble of reservoir models representing the subterranean reservoir;
   a computer processer configured to receive the stored data from the database, and to execute software responsive to the stored data; and
   computer readable software instructions configured to be executed by the processor and cause the processor to update the ensemble of reservoir models using the reservoir data and a subspace ensemble Kalman filter that constrains each ensemble member of the ensemble of reservoir models to a different subspace of a full space, wherein an equation is used to update the ensemble of reservoir models, wherein the equation is:

$$m_j^u = g^j\left(\xi_j^f + \frac{dg^j(\xi)}{d\xi_j^f}K_g(d_{o,j} - d_j)\bigg|_{1:N_m}\right)$$

$$\forall\, j = 1, \ldots, M$$

wherein M refers to number of ensemble members of the ensemble of reservoir models;

wherein m refers to a random field;
wherein g is a parameterization function relating a small number of random variables $\xi$ to the random field m;
wherein $K_g$ refers to a Kalman Gain;
wherein $d_o$ refers to the reservoir data with perturbation; and
wherein d refers to simulated reservoir data.

9. The system of claim 8, wherein the software instructions are further configured to be executed by the processor and cause the processor to apply a different parameterization to each ensemble member of the ensemble of reservoir models.

10. The system of claim 9, wherein each parameterization ensures that ensemble members remain in a subspace to which it is constrained.

11. The system of claim 9, wherein the parameterization comprises kernel principle component analysis.

12. The system of claim 8, wherein the software instructions are further configured to be executed by the processor and cause the processor to apply kernel principle component analysis parameterization to update the ensemble of reservoir models.

13. The system of claim 8, wherein the software instructions are further configured to be executed by the processor and cause the processor to apply K-L expansion parameterization to update the ensemble of reservoir models.

14. The system of claim 8, wherein the subterranean reservoir has non-Gaussian characteristics, and wherein the updated ensemble of reservoir models is consistent with the reservoir data from the subterranean reservoir and preserves the non-Gaussian characteristics of the subterranean reservoir.

15. A non-transitory computer readable medium containing computer readable software instructions configured to be executed by a processor and cause the processor to perform a method for updating simulation models of a subterranean reservoir, the method comprising updating an ensemble of reservoir models using reservoir data and a subspace ensemble Kalman filter that constrains each ensemble member of the ensemble of reservoir models to a different subspace of a full space, wherein an equation is used to update the ensemble of reservoir models, wherein the equation is:

$$m_j^u = g^j\left(\xi_j^f + \frac{dg^j(\xi)}{d\xi_j^f}K_g(d_{o,j}-d_j)\bigg|_{1:N_m}\right)$$

$$\forall\, j=1,\ldots,M$$

wherein M refers to number of ensemble members of the ensemble of reservoir models;
wherein g is a parameterization function relating a small number of random variables $\xi$ to the random field m;
wherein $K_g$ refers to a Kalman Gain;
wherein $d_o$ refers to the reservoir data with perturbation; and
wherein d refers to simulated reservoir data.

16. The non-transitory computer readable medium of claim 15, wherein the software instructions are further configured to be executed by the processor and cause the processor to apply a different parameterization to each ensemble member of the ensemble of reservoir models.

17. The non-transitory computer readable medium of claim 16, wherein each parameterization ensures that ensemble members remain in a subspace to which it is constrained and the parameterization comprises kernel principle component analysis.

18. The non-transitory computer readable medium of claim 15, wherein the software instructions are further configured to be executed by the processor and cause the processor to apply kernel principle component analysis parameterization to update the ensemble of reservoir models.

19. The non-transitory computer readable medium of claim 15, wherein the software instructions are further configured to be executed by the processor and cause the processor to apply K-L expansion parameterization to update the ensemble of reservoir models.

20. The non-transitory computer readable medium of claim 15, wherein the subterranean reservoir has non-Gaussian characteristics, and wherein the updated ensemble of reservoir models is consistent with the reservoir data from the subterranean reservoir and preserves the non-Gaussian characteristics of the subterranean reservoir.

* * * * *